(12) United States Patent
Nakatsuka et al.

(10) Patent No.: US 8,022,794 B2
(45) Date of Patent: Sep. 20, 2011

(54) MICROMACHINE SWITCH, FILTER CIRCUIT, DUPLEXER CIRCUIT, AND COMMUNICATION DEVICE

(75) Inventors: Hiroshi Nakatsuka, Osaka (JP); Takehiko Yamakawa, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 475 days.

(21) Appl. No.: 12/297,334

(22) PCT Filed: Apr. 25, 2007

(86) PCT No.: PCT/JP2007/058975
§ 371 (c)(1),
(2), (4) Date: Oct. 16, 2008

(87) PCT Pub. No.: WO2007/125969
PCT Pub. Date: Nov. 8, 2007

(65) Prior Publication Data
US 2009/0277762 A1    Nov. 12, 2009

(30) Foreign Application Priority Data
Apr. 28, 2006 (JP) ................. 2006-125551

(51) Int. Cl.
*H01P 1/10* (2006.01)
*H01H 57/00* (2006.01)
(52) U.S. Cl. ..................... 333/262; 333/101
(58) Field of Classification Search ............ 333/101, 333/105, 106, 262; 200/181, 11 R
See application file for complete search history.

(56) References Cited

U.S. PATENT DOCUMENTS

| | | | |
|---|---|---|---|
| 5,121,089 A | | 6/1992 | Larson |
| 6,072,686 A | * | 6/2000 | Yarbrough ............ 361/234 |
| 7,676,243 B2 | * | 3/2010 | Leinonen et al. ........ 455/550.1 |

FOREIGN PATENT DOCUMENTS

| | | |
|---|---|---|
| JP | 58-12235 | 1/1983 |
| JP | 58-40723 | 3/1983 |
| JP | 4-289783 | 10/1992 |
| JP | 4-306520 | 10/1992 |
| JP | 6-21532 | 1/1994 |
| JP | 6-38562 | 2/1994 |
| JP | 11-45649 | 2/1999 |
| JP | 2003-217421 | 7/2003 |
| JP | 2005-302711 | 10/2005 |
| WO | 2005/117051 | 12/2005 |

OTHER PUBLICATIONS

International Search Report mailed Jun. 12, 2007 for International Application No. PCT/JP2007/058975.

* cited by examiner

*Primary Examiner* — Dean Takaoka
(74) *Attorney, Agent, or Firm* — Wenderoth, Lind & Ponack, L.L.P.

(57) ABSTRACT

A micromachine switch switches an electrical connection between signal electrodes in accordance with control signals. The micromachine switch includes a substrate, a rotating body provided on the substrate, and a movable electrode provided on the rotating body. The micromachine switch also includes a first signal electrode, one end of which is electrically connected to one end of the movable electrode, and a second signal electrode provided near the rotating body to be positioned such that a rotation of the rotating body causes the second signal electrode to be electrically connected to another end of the movable electrode. Further, a drive section causes, based on a first control signal, the rotating body to rotate until the movable electrode and the second signal electrode are electrically connected, and causes, based on a second control signal, the rotating body to rotate until the movable electrode and the second signal electrode are disconnected.

12 Claims, 26 Drawing Sheets

[FIG. 1A]
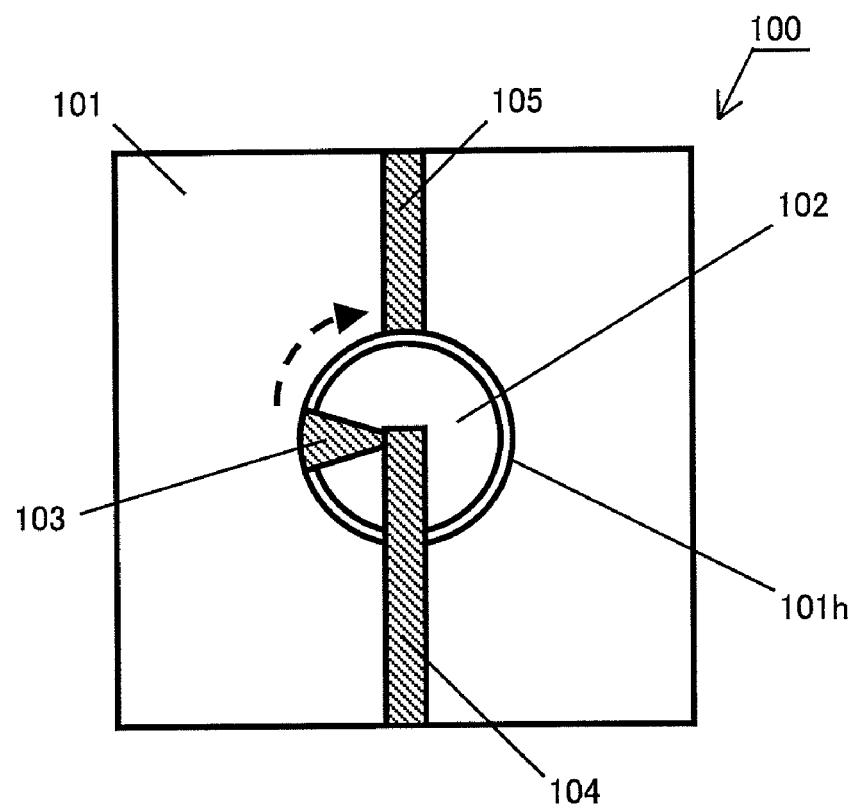

[FIG. 1B]
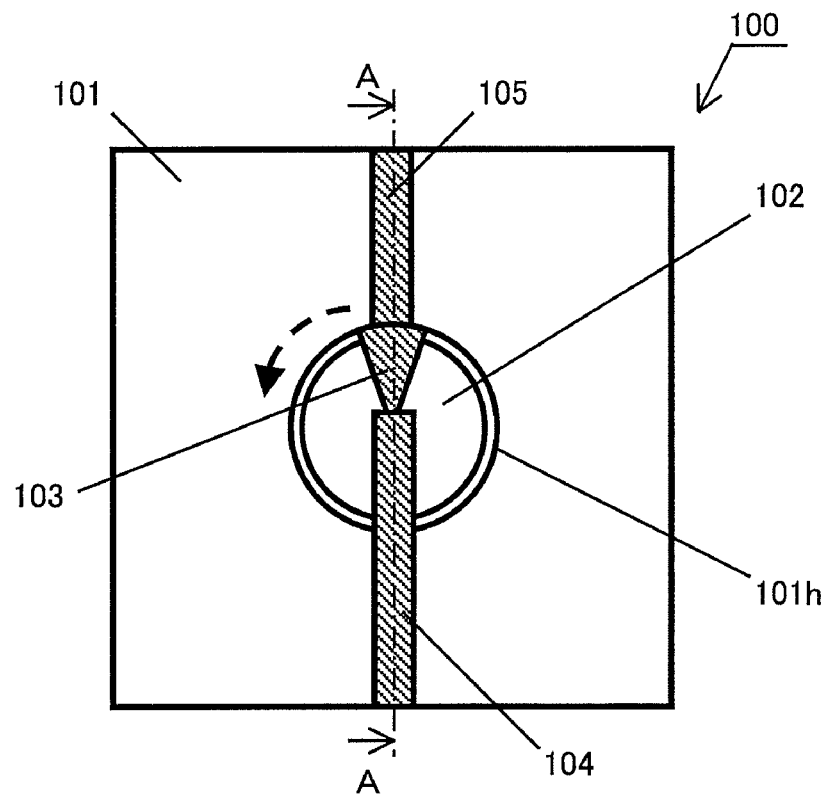
[FIG. 2]
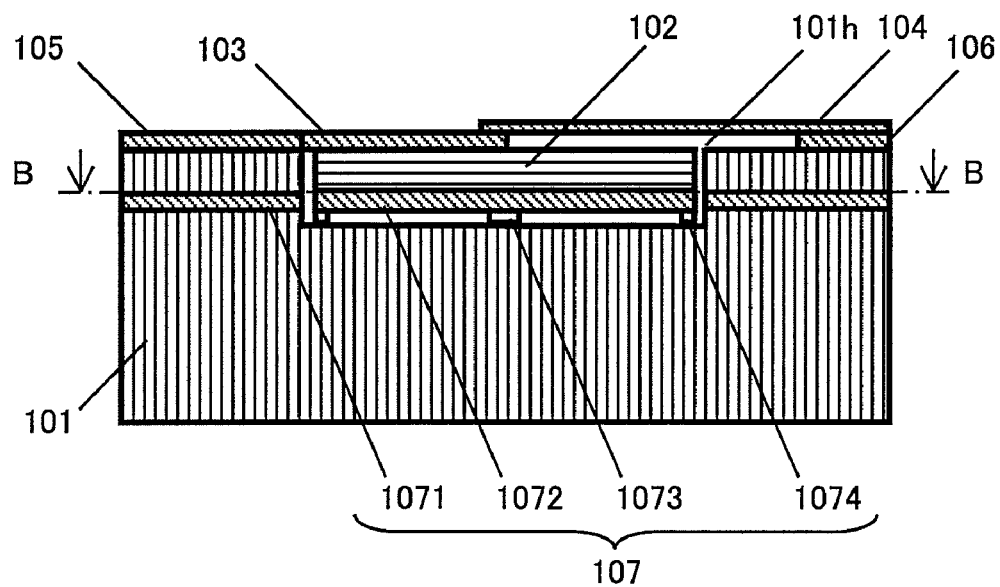

[FIG. 3]
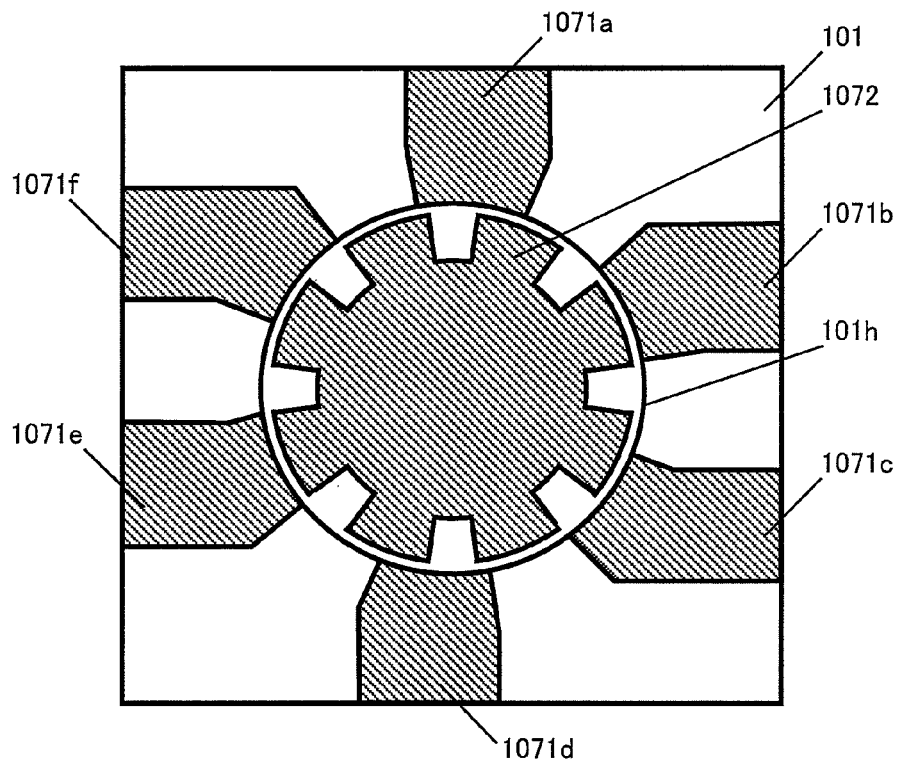
[FIG. 4]
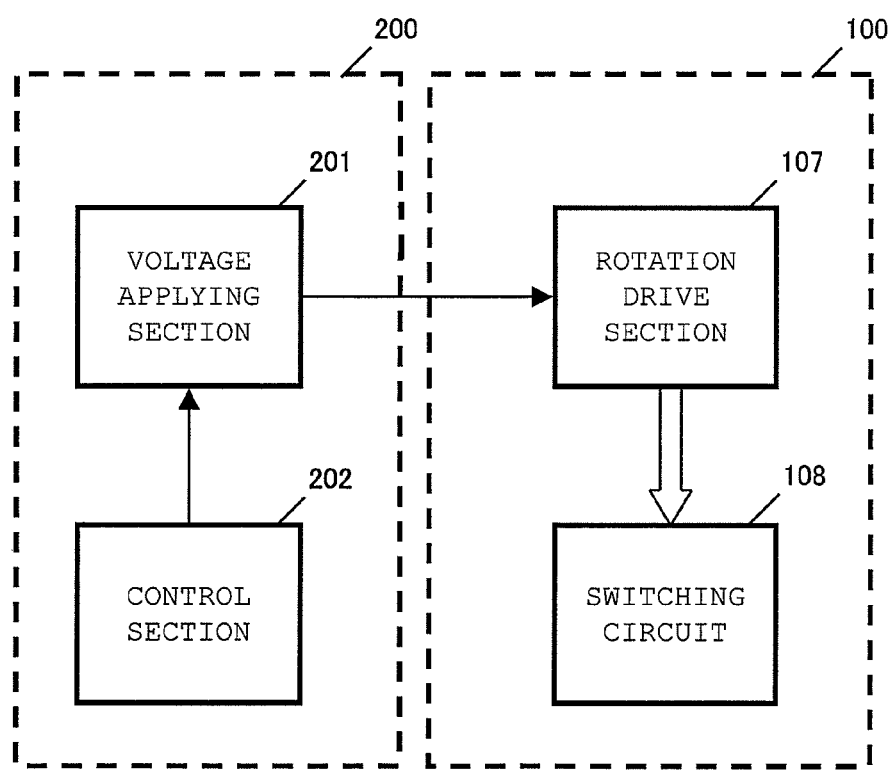

[FIG. 5A]
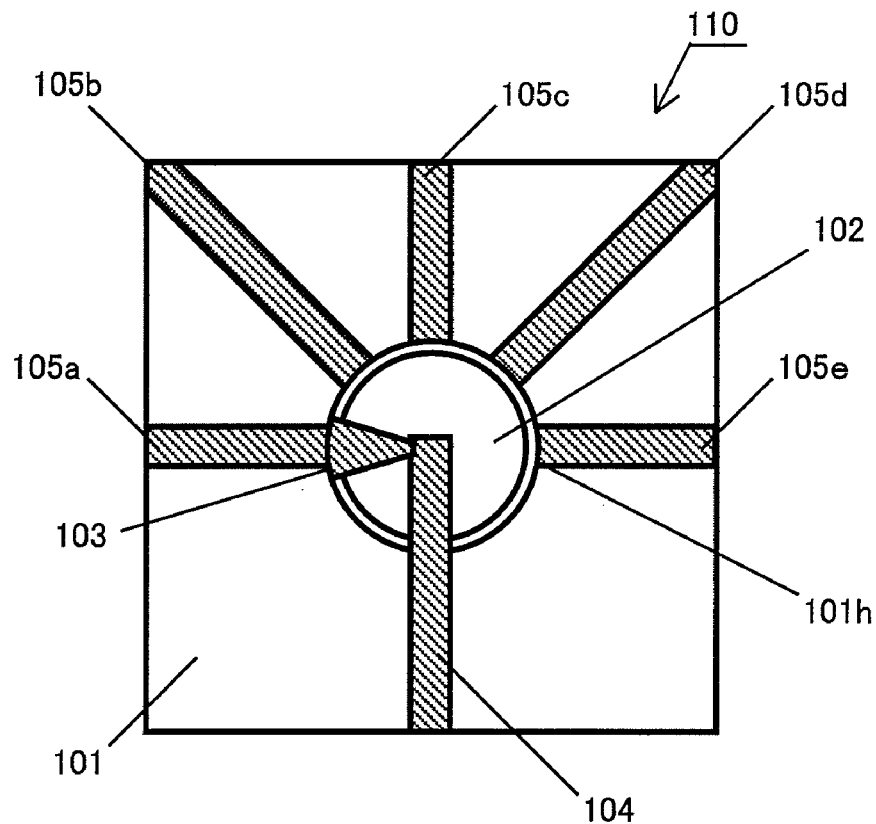
[FIG. 5B]
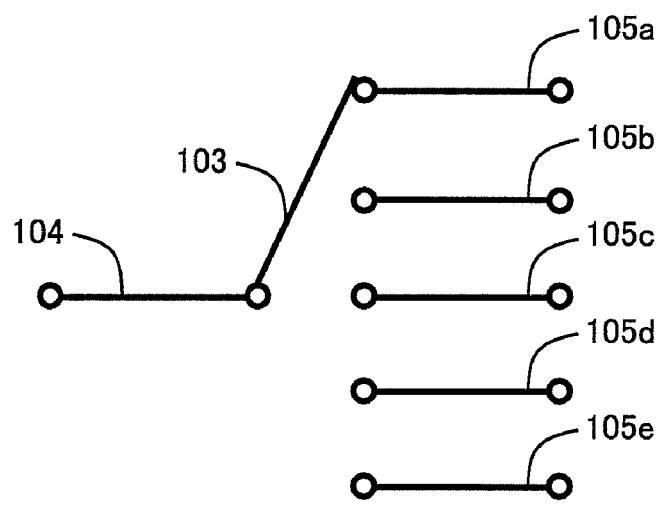

[FIG. 6A]
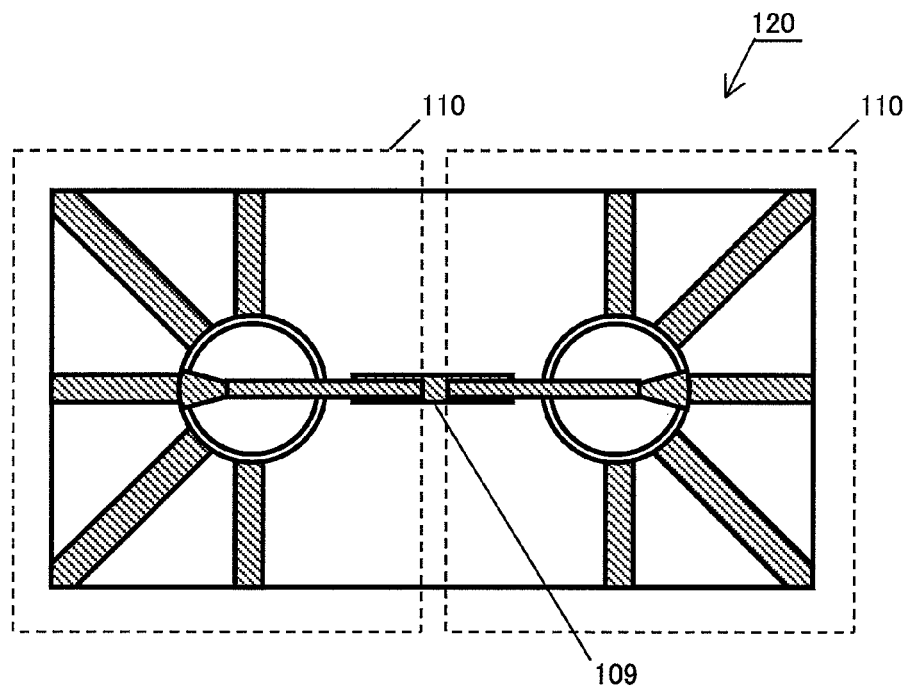
[FIG. 6B]
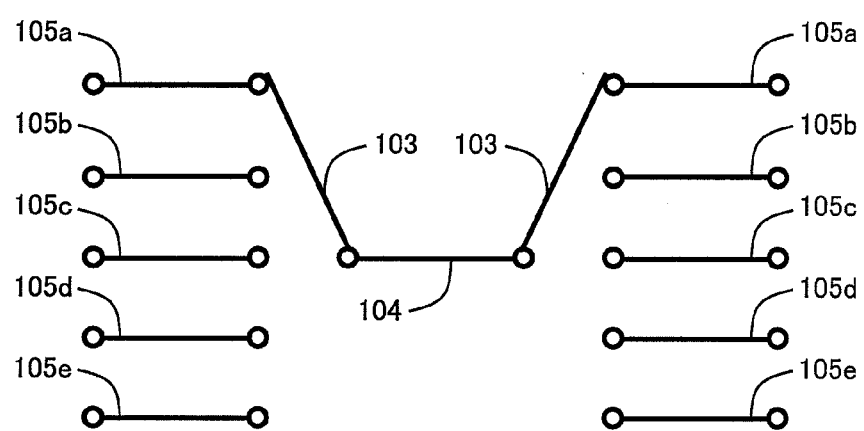

[FIG. 7]
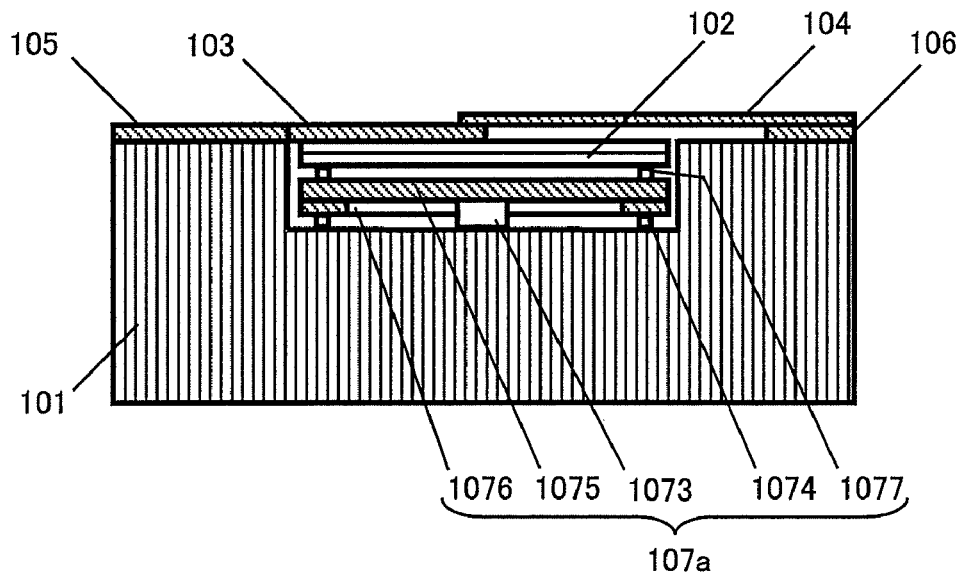
[FIG. 8]
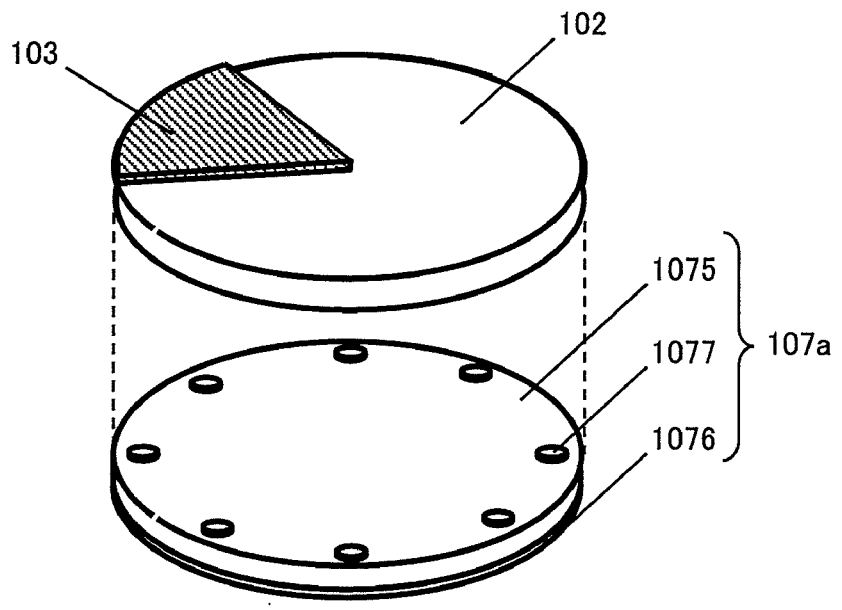

[FIG. 9A]
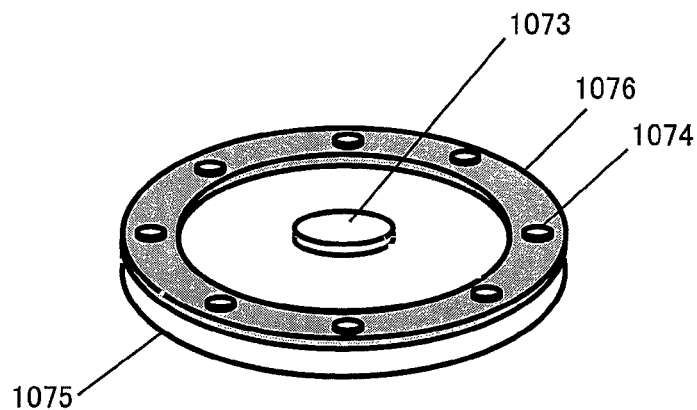
[FIG. 9B]
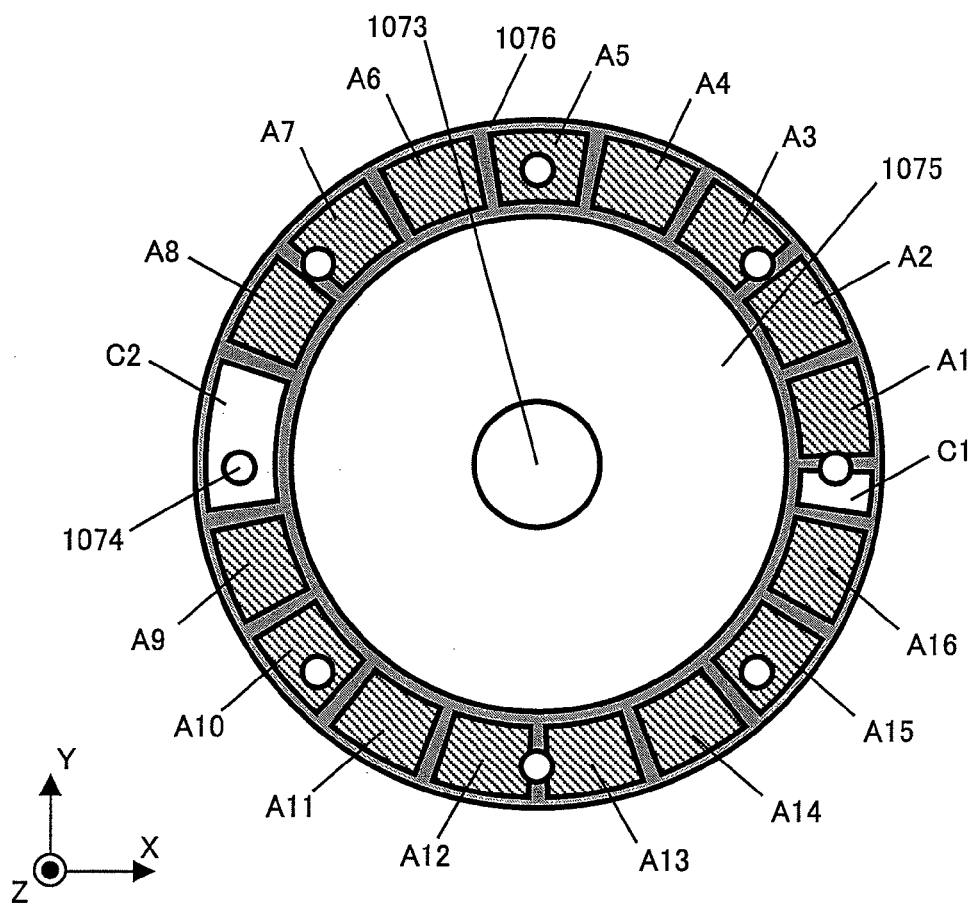

[FIG. 10A]
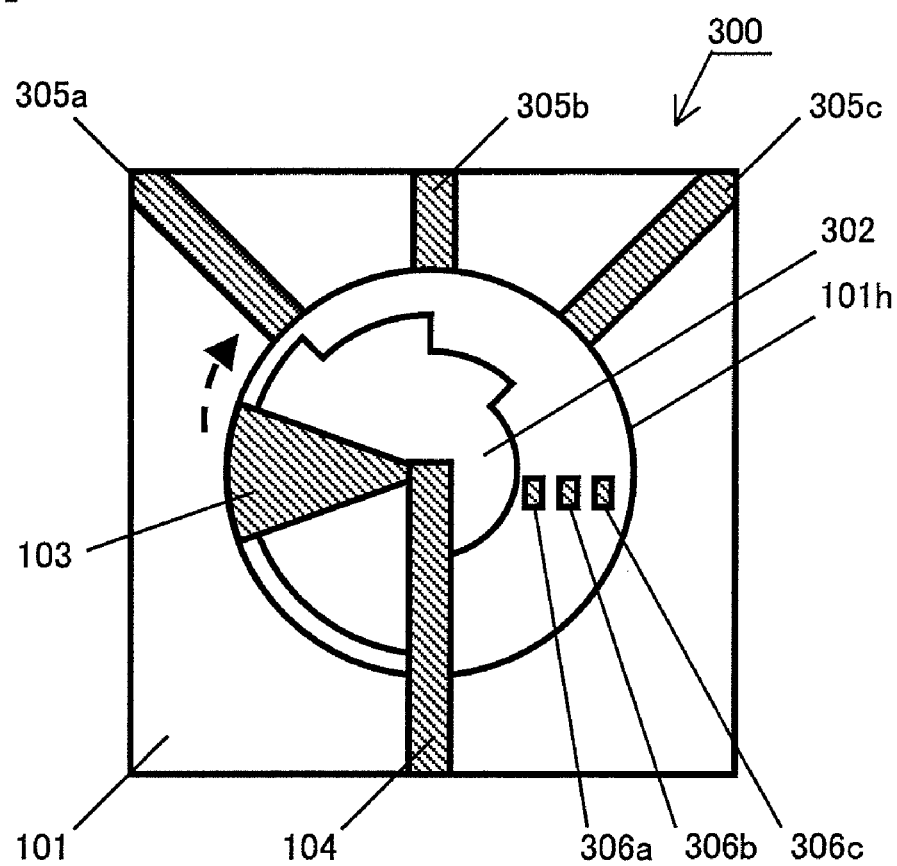

[FIG. 10B]
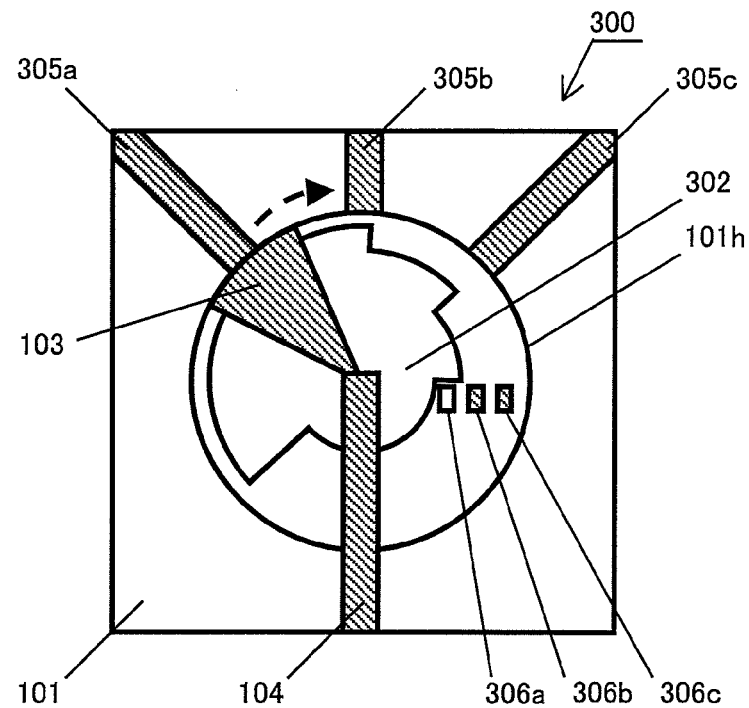
[FIG. 10C]
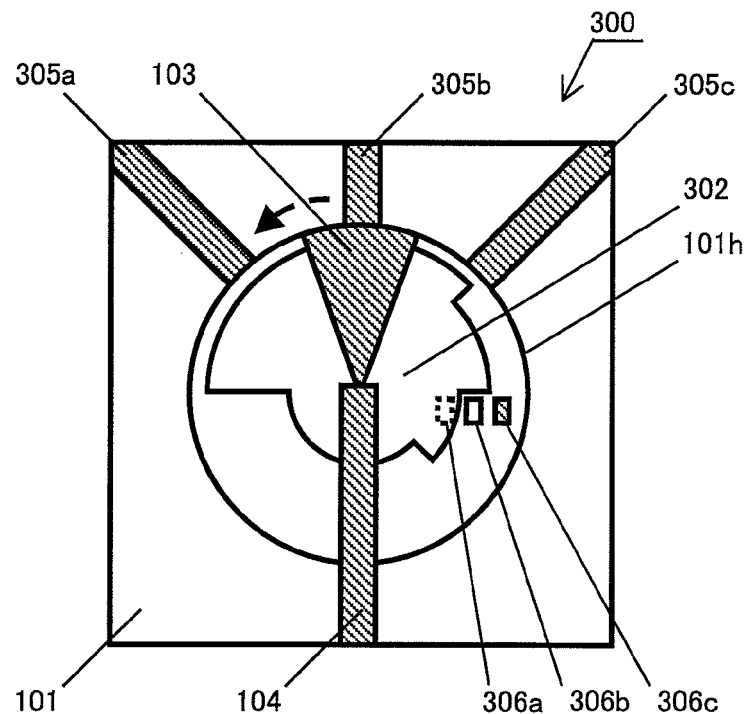

[FIG. 11]
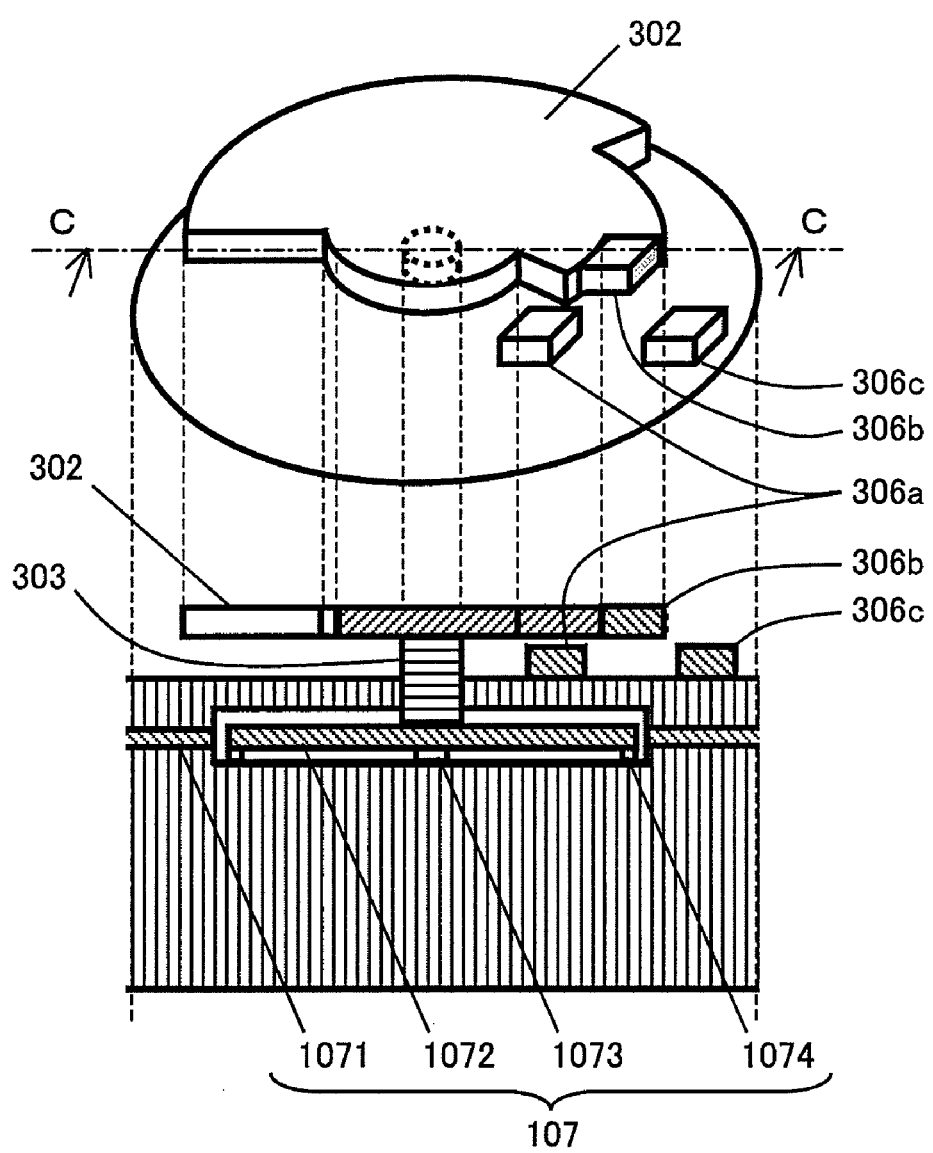

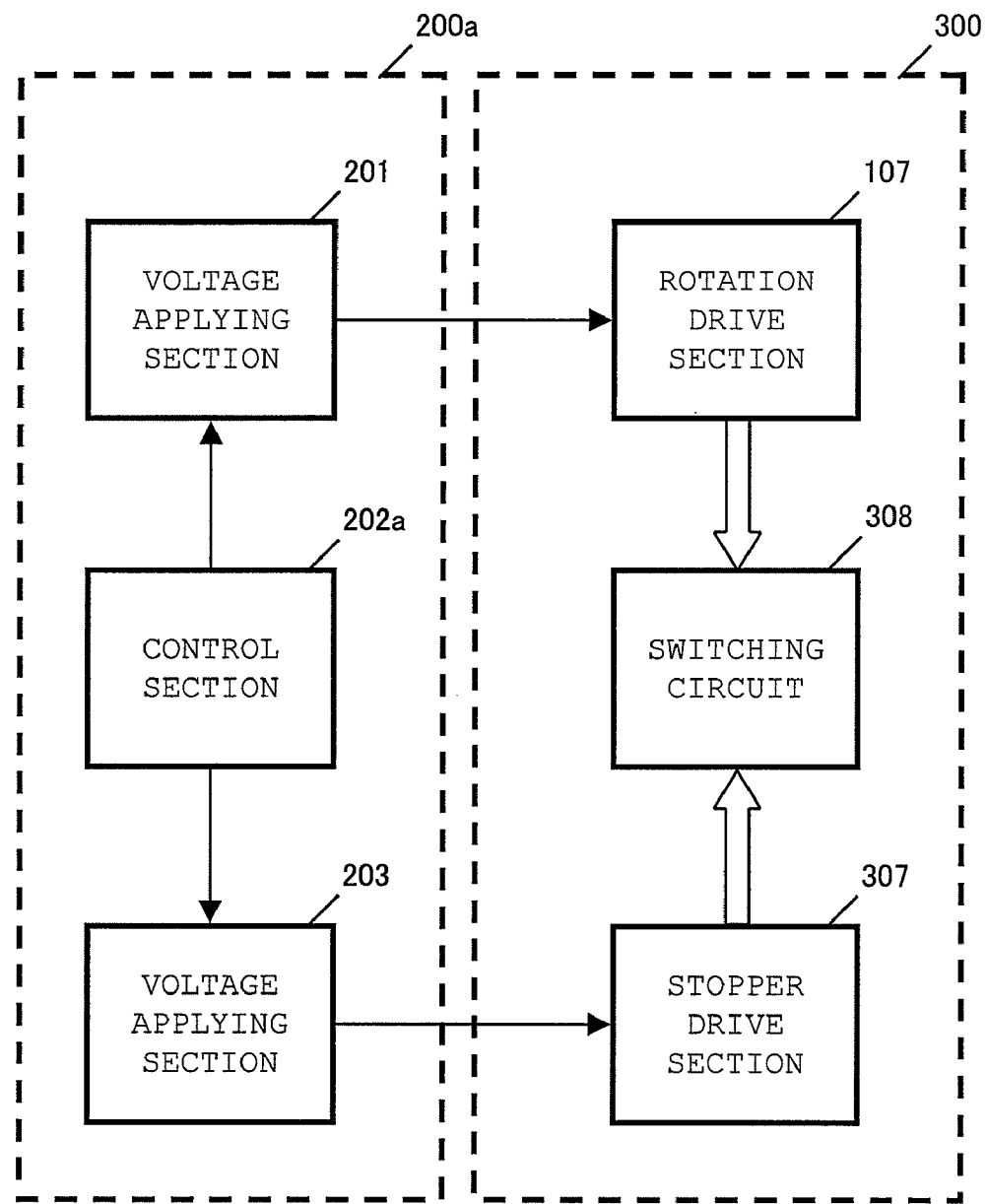
[FIG. 12]

[FIG. 13A]
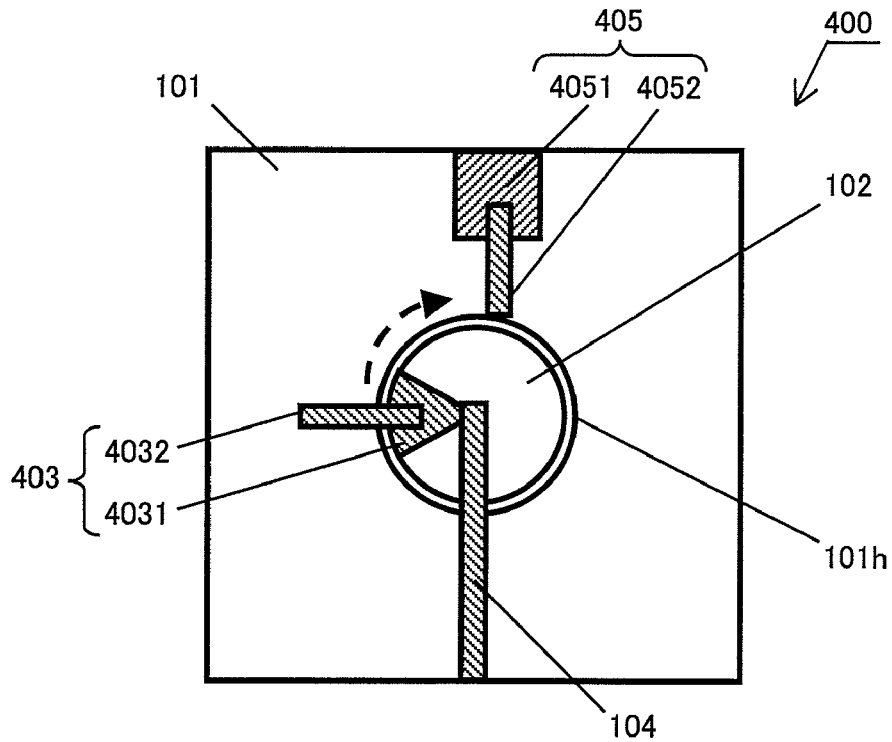
[FIG. 13B]
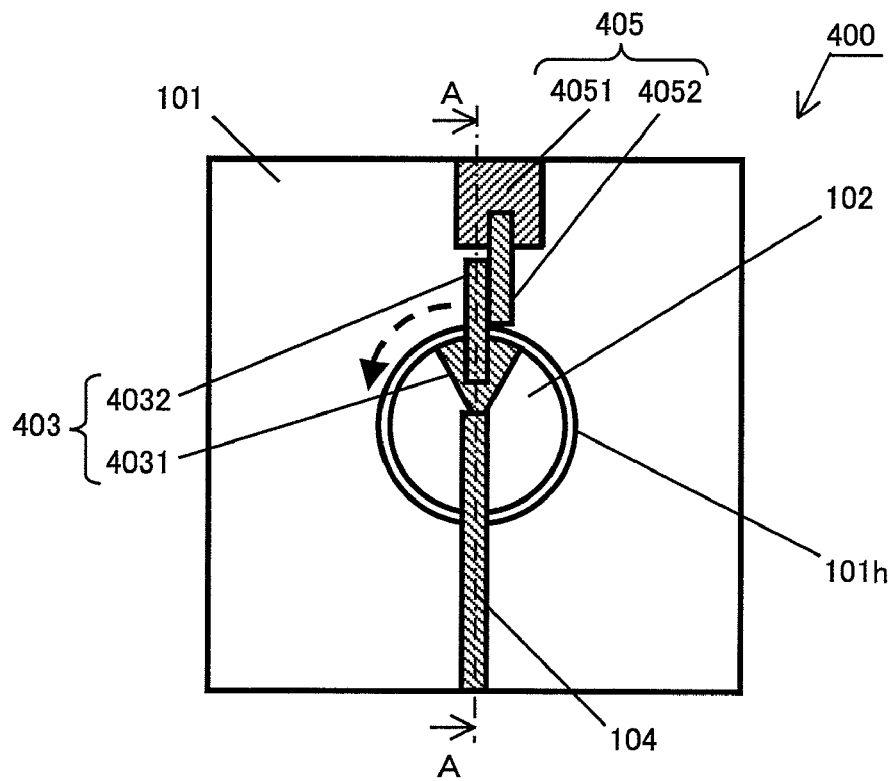

[FIG. 14]
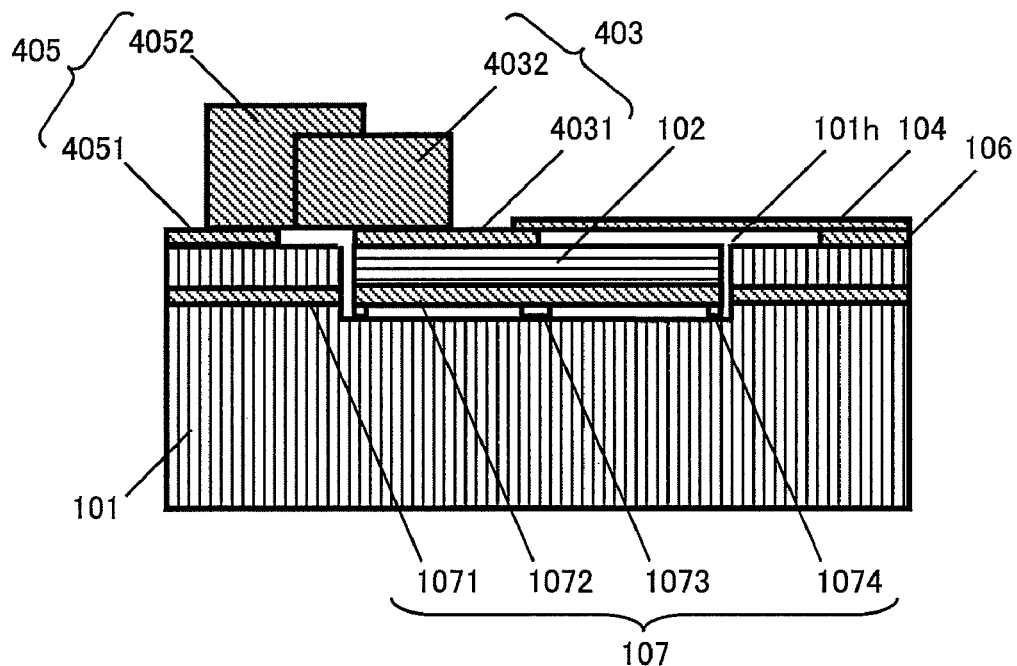
[FIG. 15]
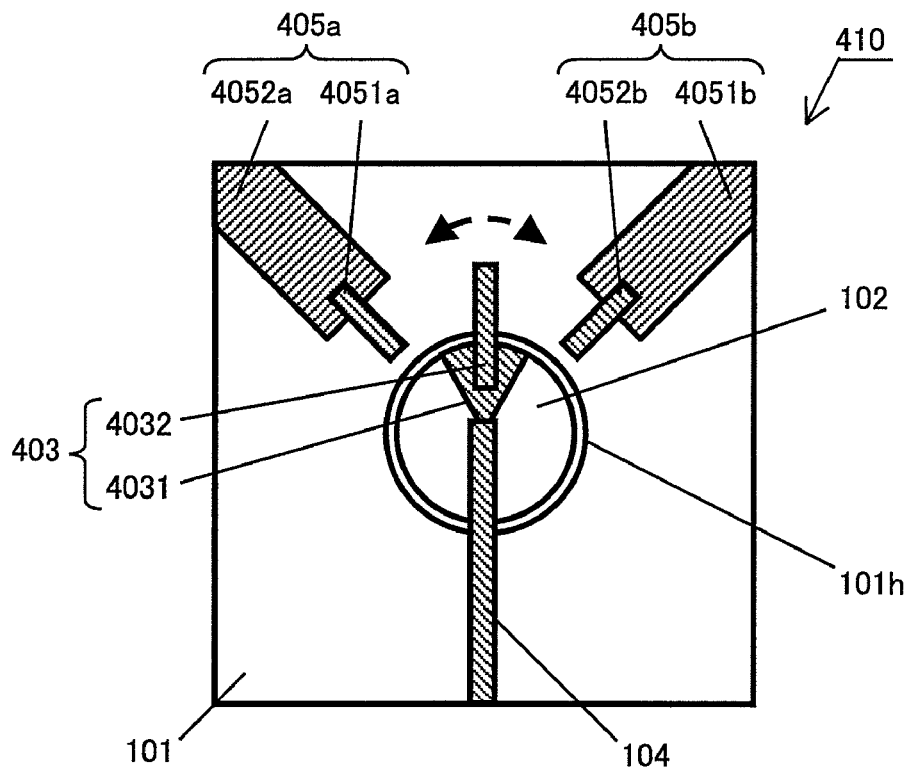

[FIG. 16A]
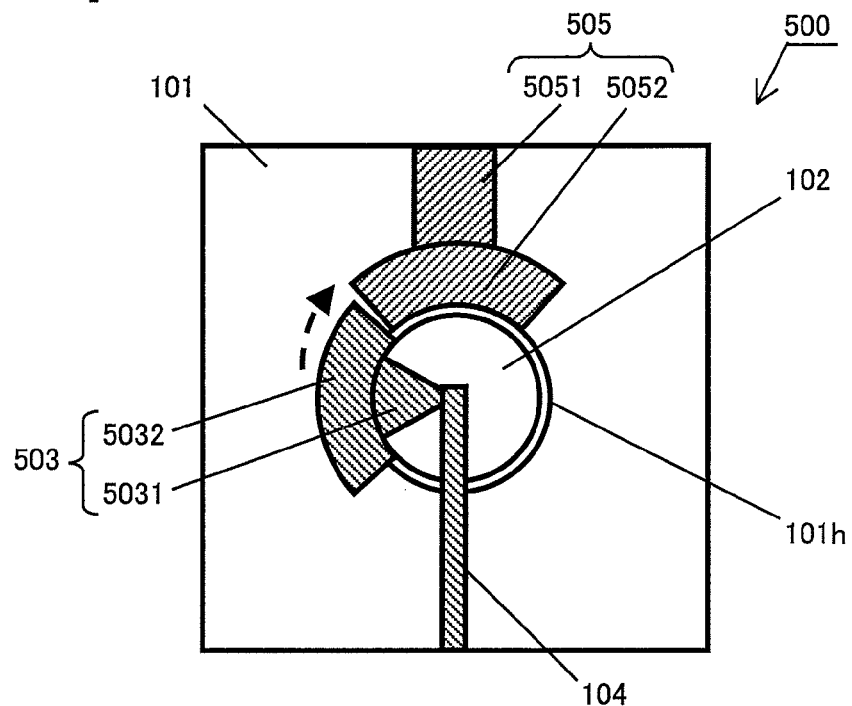
[FIG. 16B]
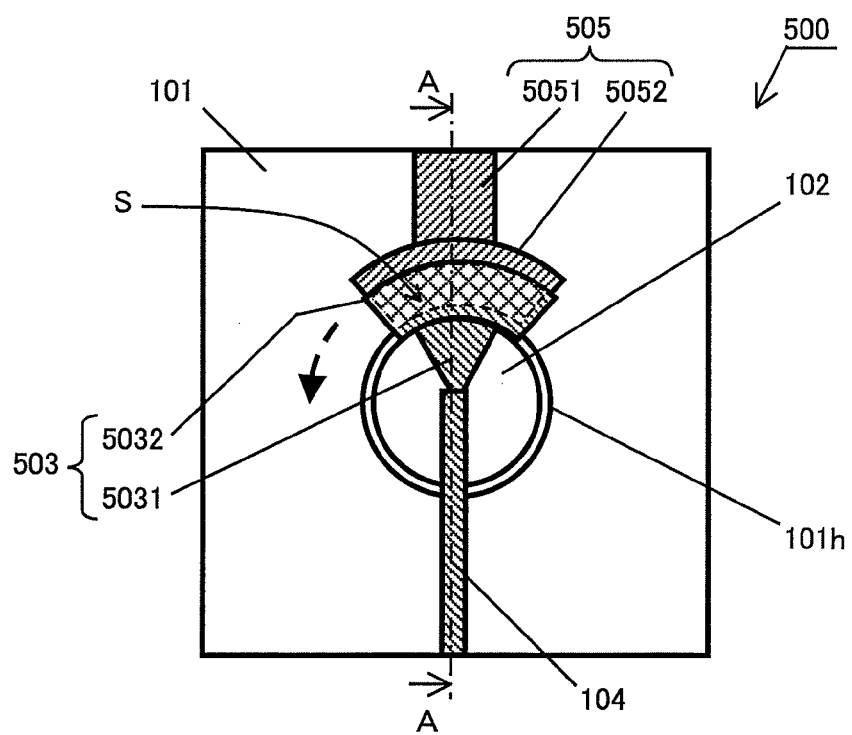

[FIG. 17]
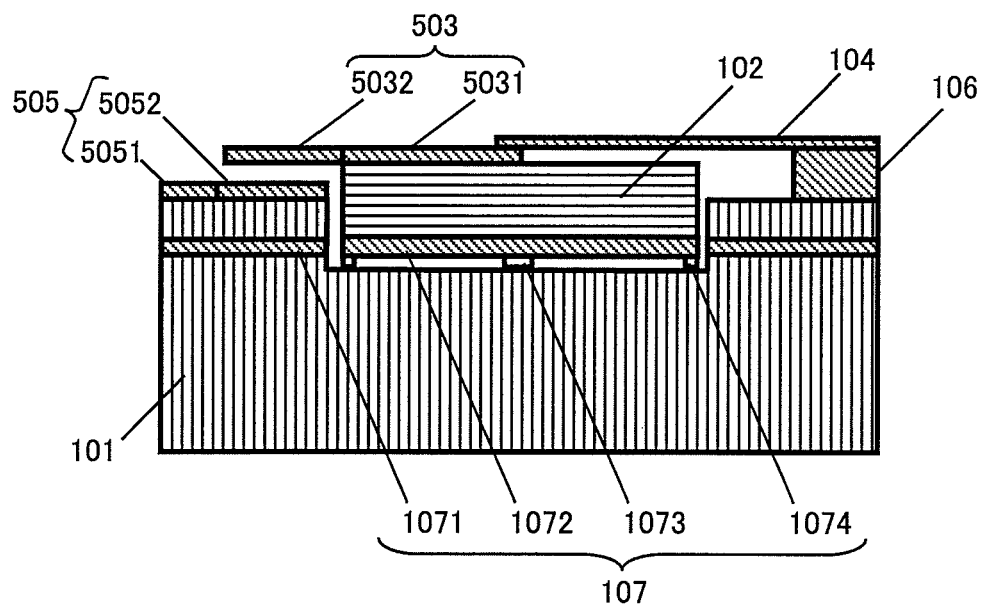
[FIG. 18A]
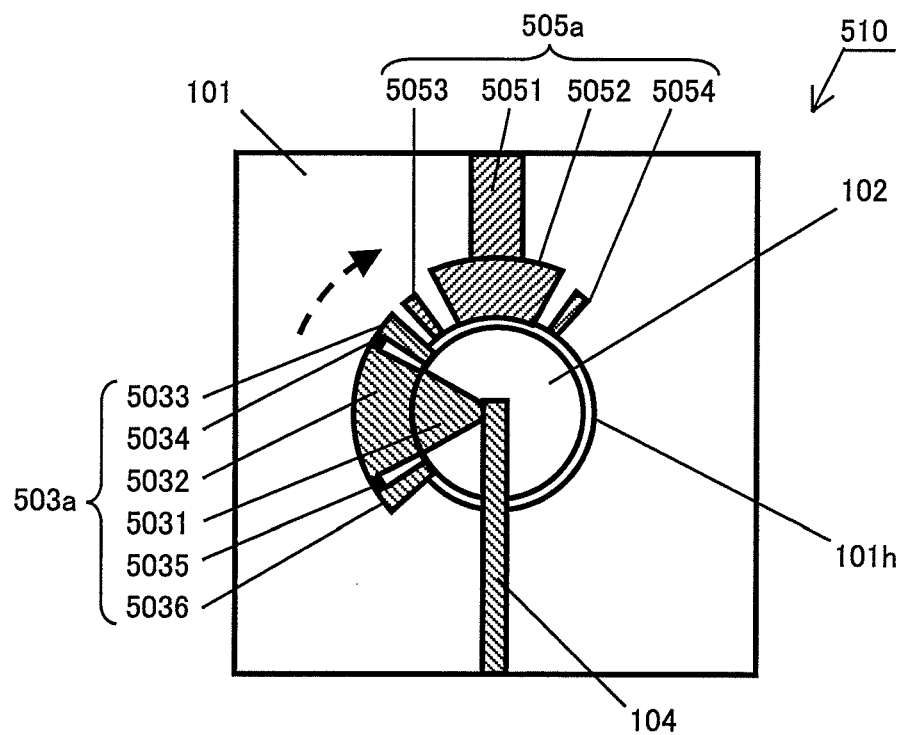

[FIG. 18B]
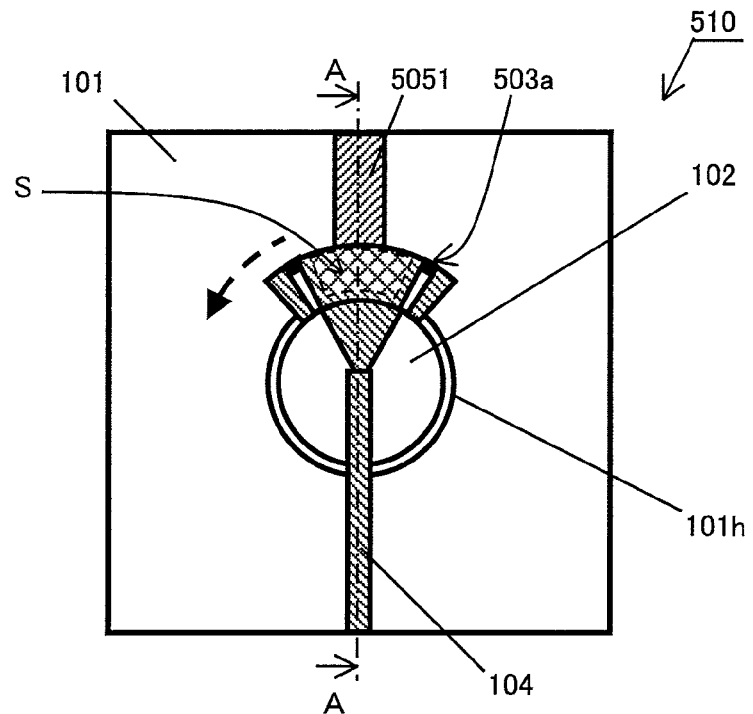
[FIG. 19]
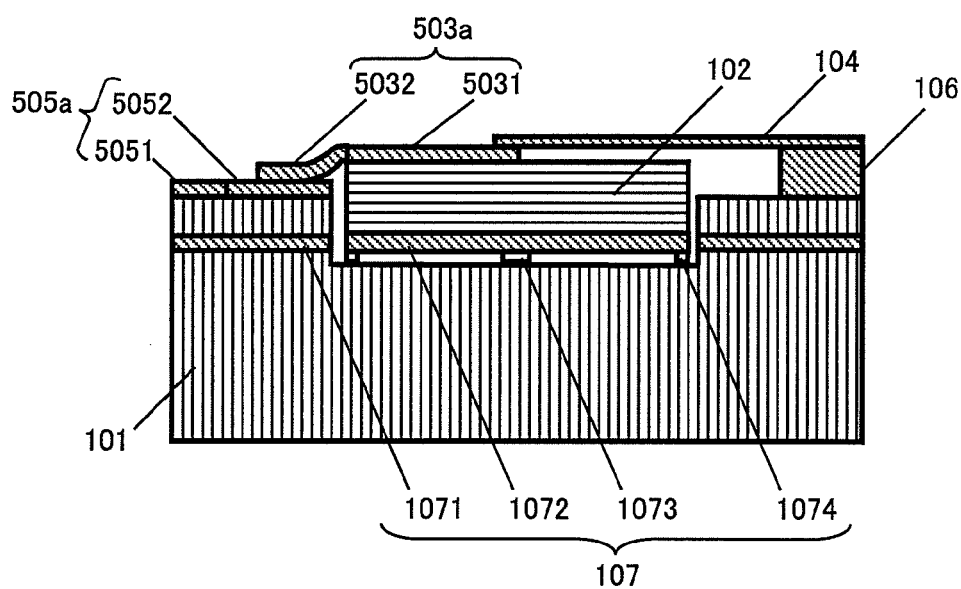

[FIG. 20A]
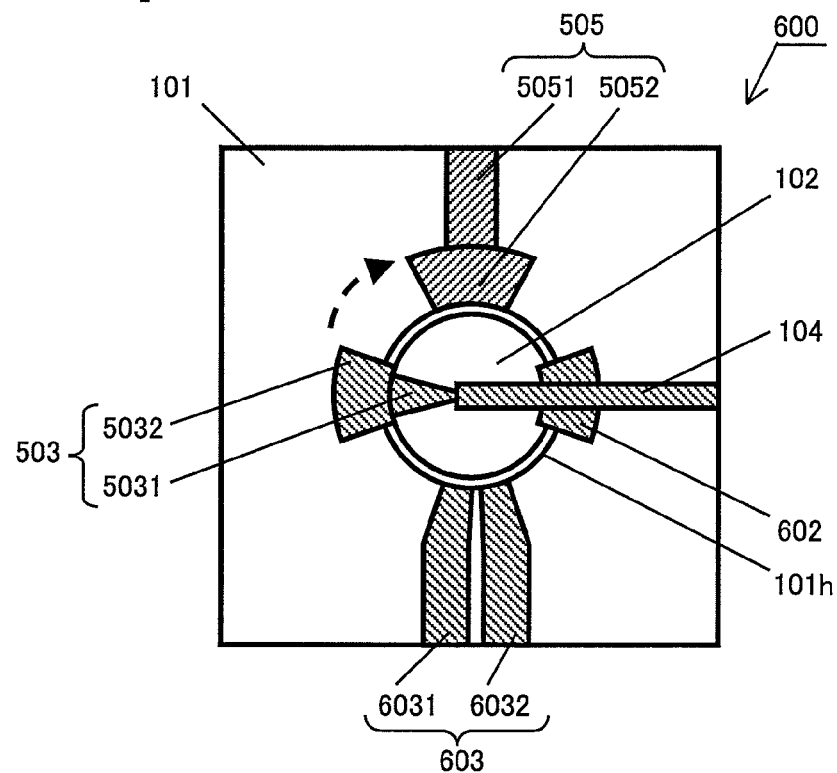
[FIG. 20B]
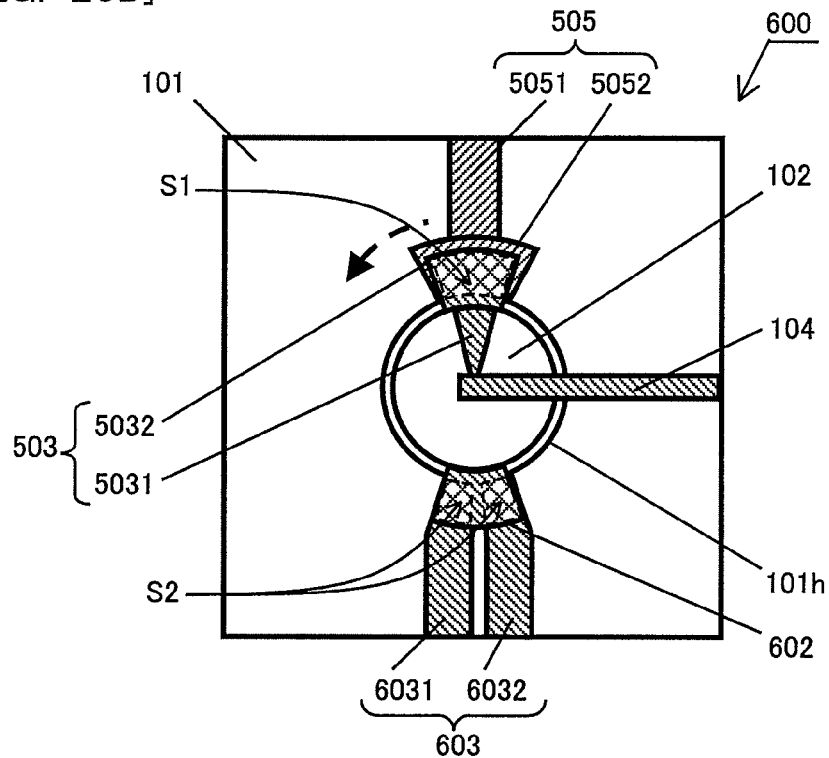

[FIG. 21]
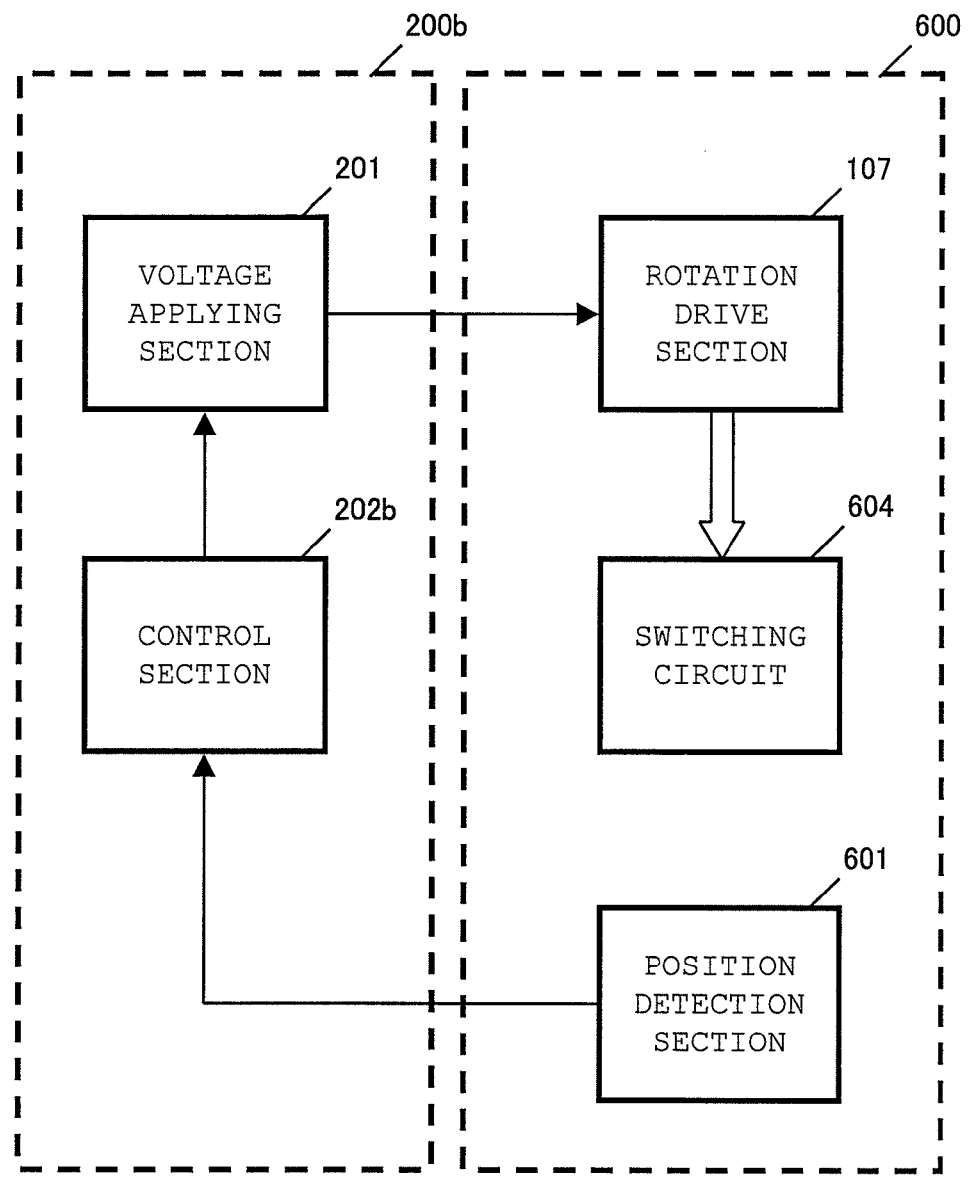

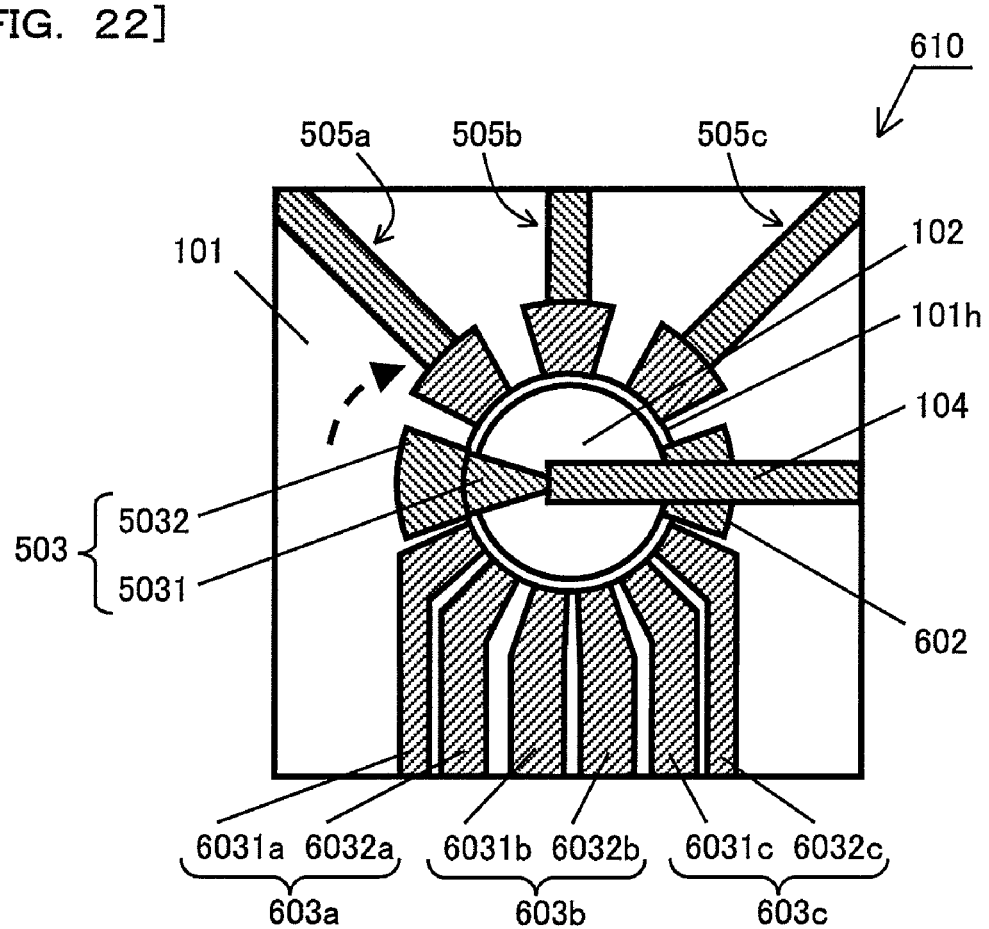
[FIG. 22]

[FIG. 23]
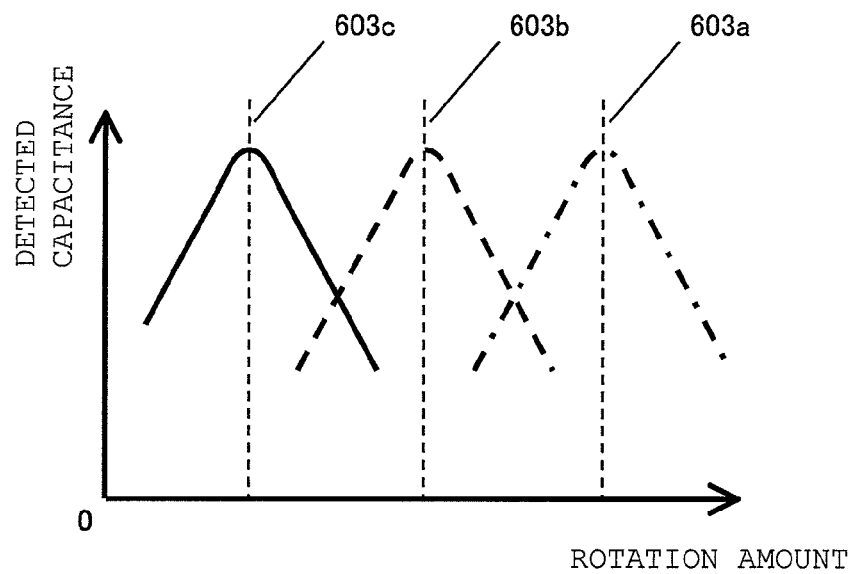
[FIG. 24]
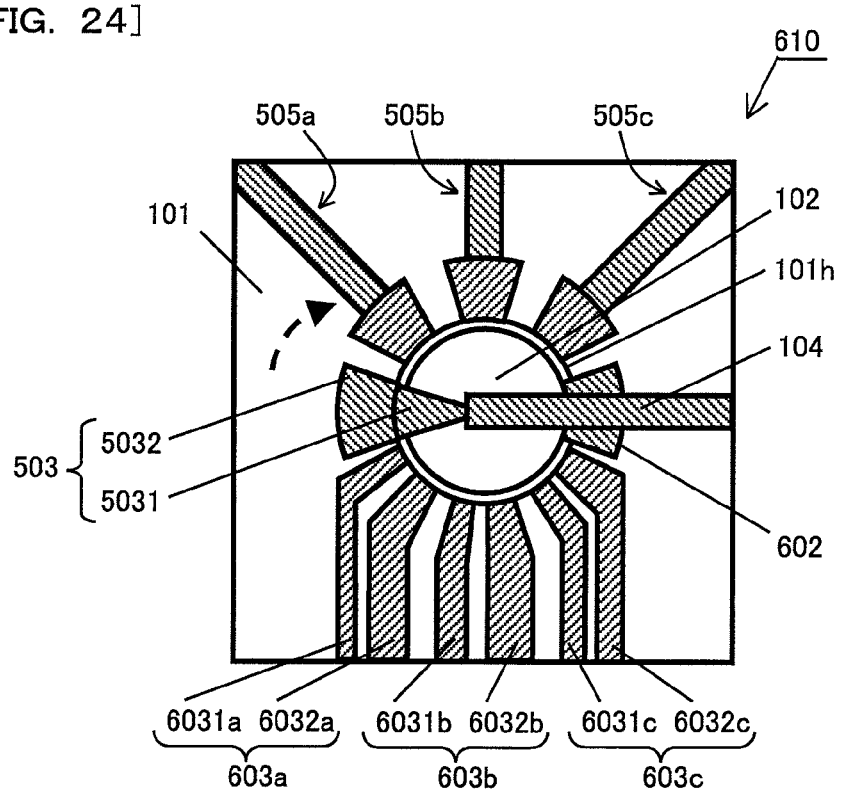

[FIG. 25]
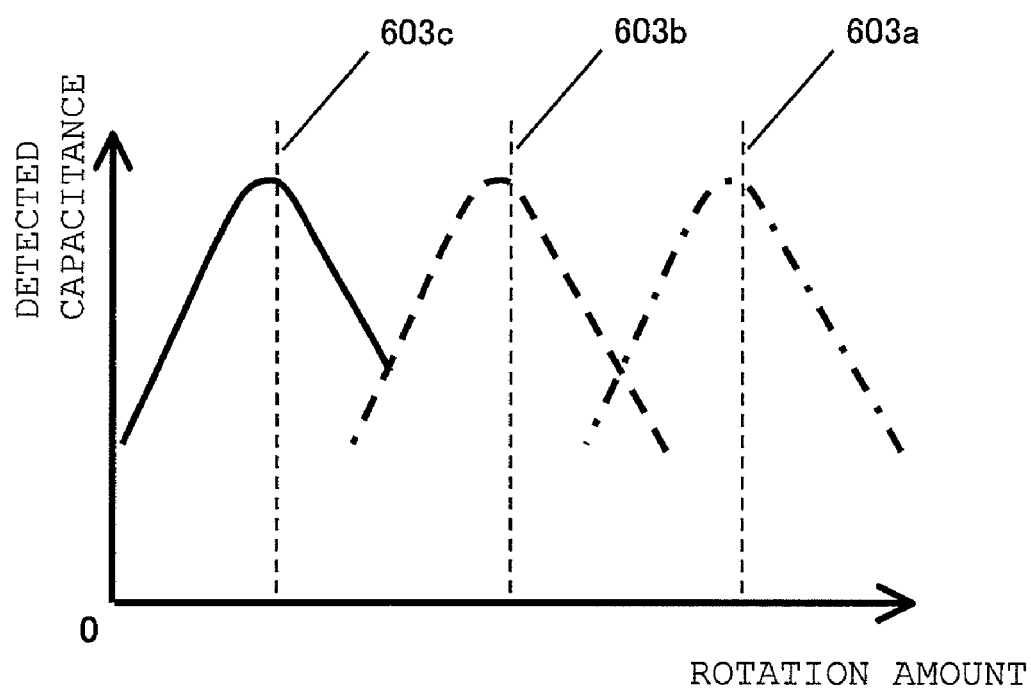

[FIG. 26]
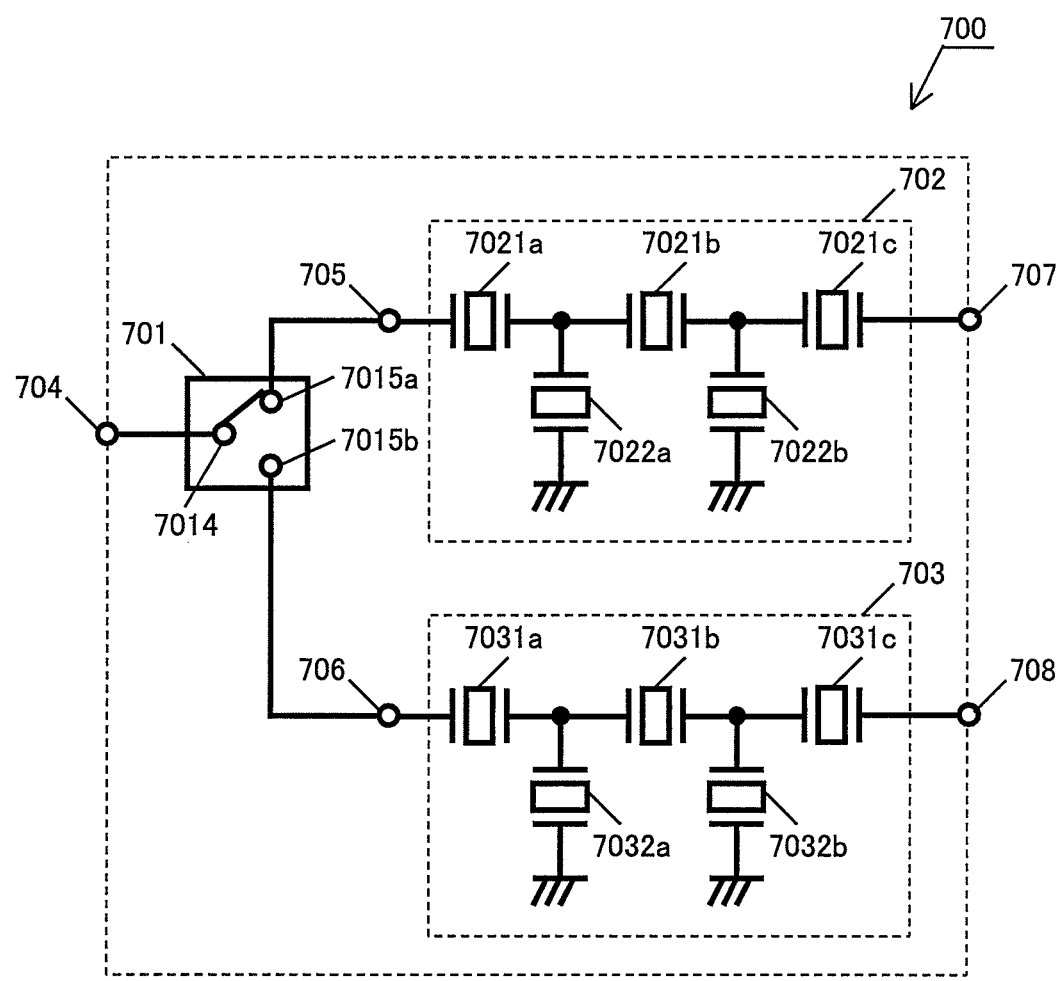

[FIG. 27]
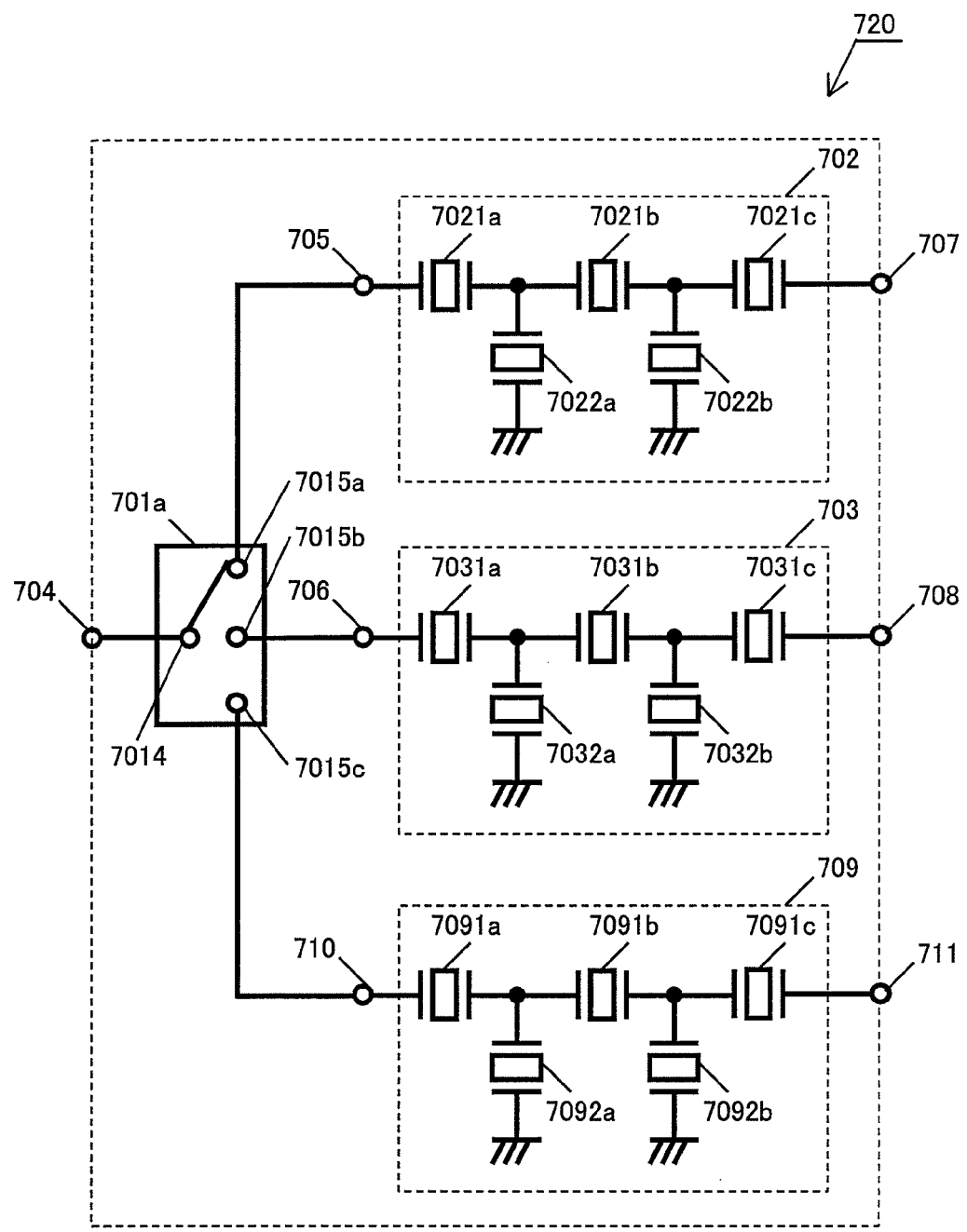

[FIG. 28]
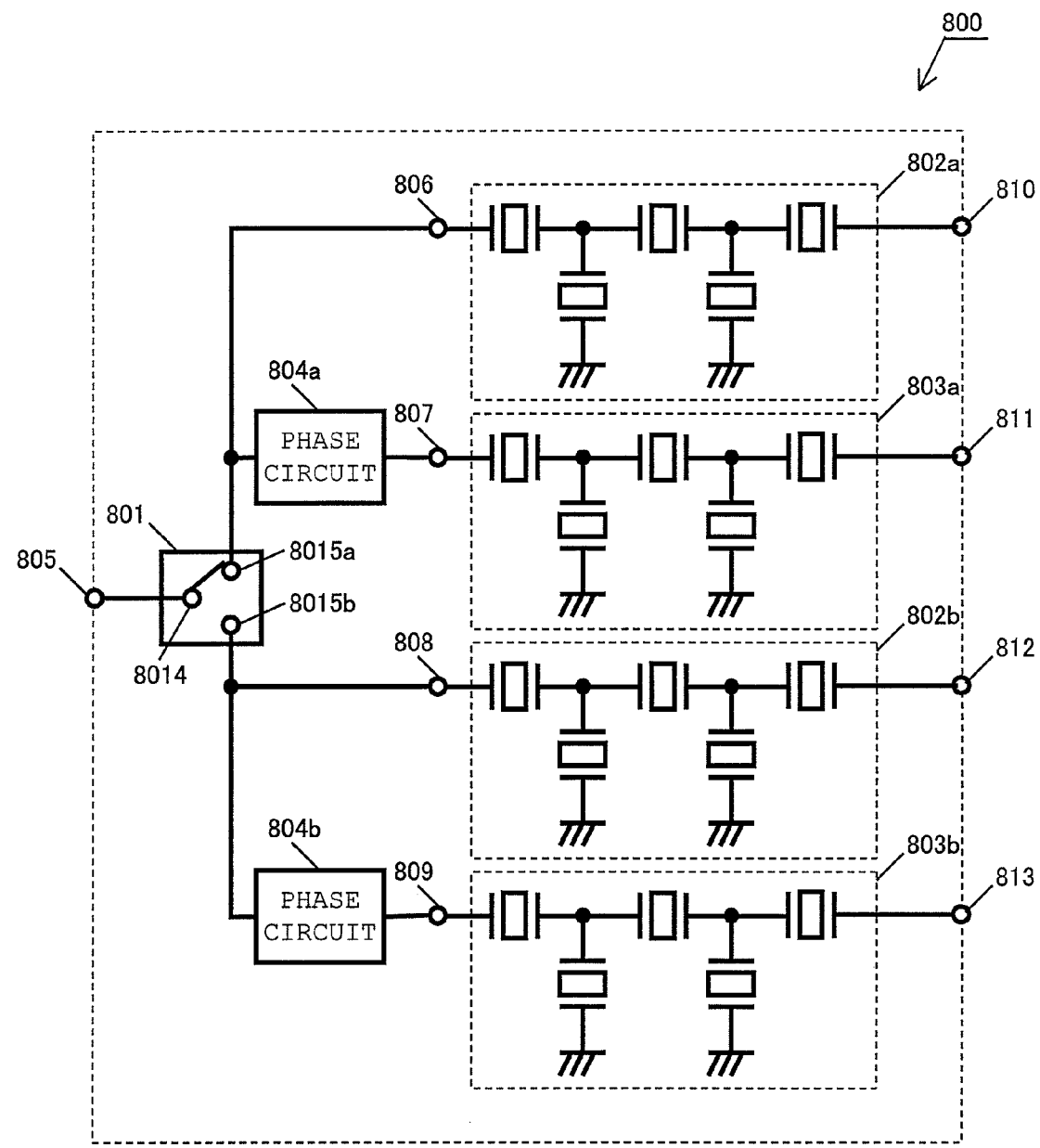

[FIG. 29]
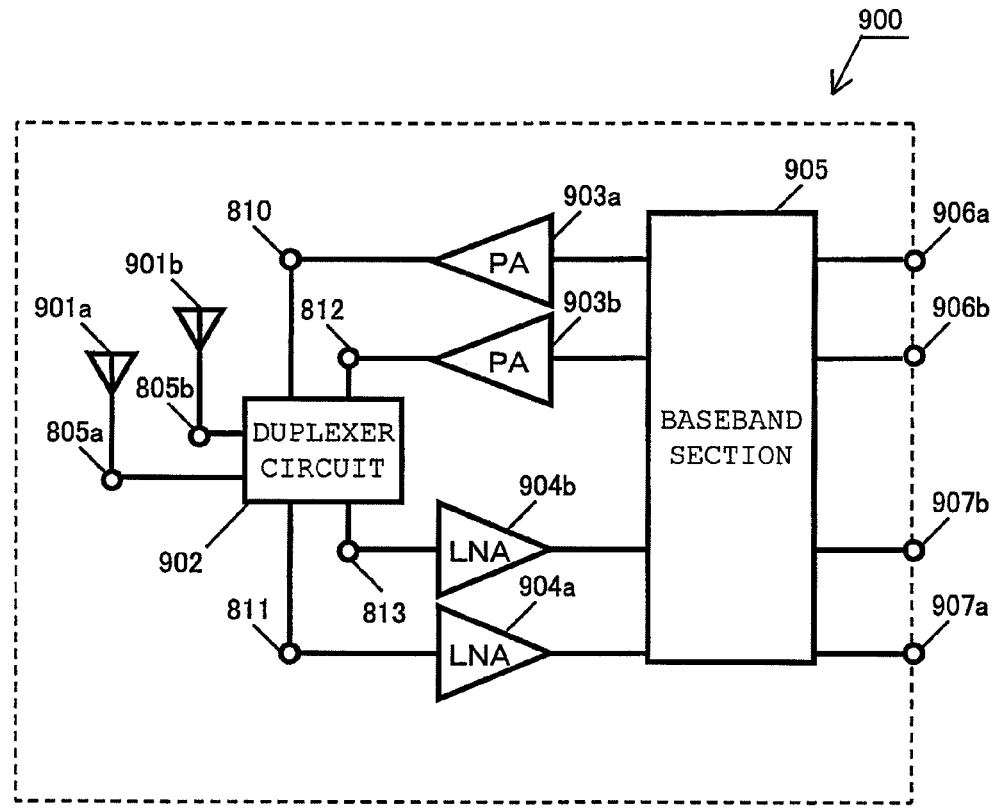
[FIG. 30]
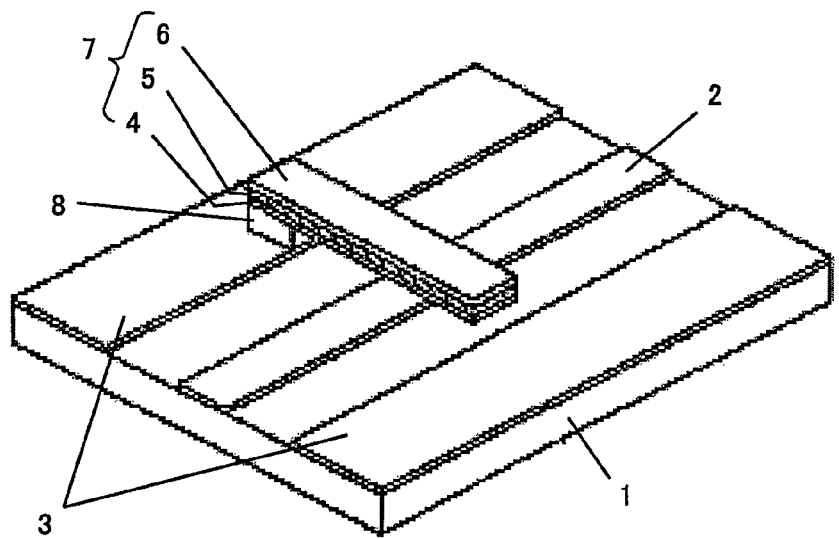

[FIG. 31]
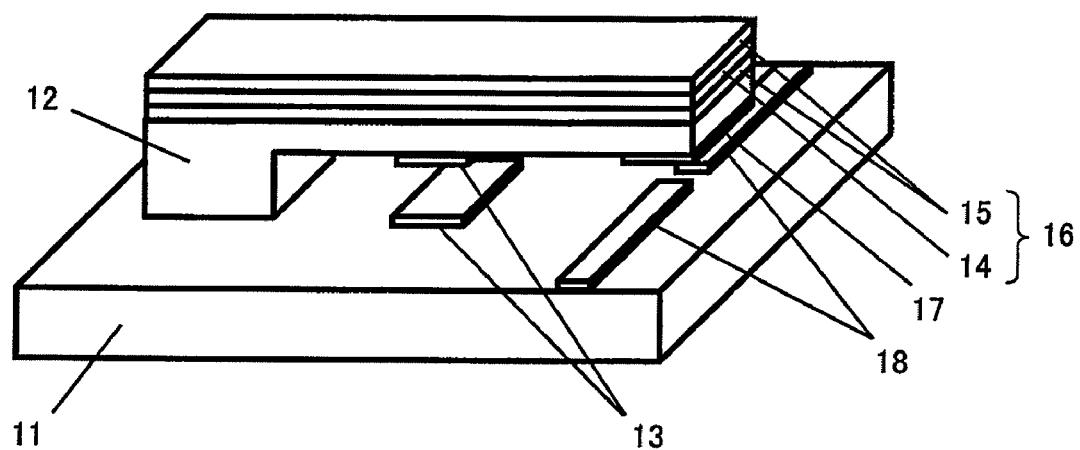

MICROMACHINE SWITCH, FILTER CIRCUIT, DUPLEXER CIRCUIT, AND COMMUNICATION DEVICE

TECHNICAL FIELD

The present invention relates to a micromachine switch, a filter circuit, a duplexer circuit and a communication device. The present invention particularly relates to: a micromachine switch which is used to perform switching for a high-frequency signal in a high-frequency circuit of a mobile communication terminal (mobile phone, wireless LAN device or the like); and a filter circuit, a duplexer circuit and a communication device which use the micromachine switch.

BACKGROUND ART

Conventionally, there are known micromachine switches which use the piezoelectric effect (e.g., Patent Document 1) or which use both the piezoelectric effect and the electrostatic effect (e.g., Patent Document 2).

With reference to FIG. 30, a micromachine switch using the piezoelectric effect will be described in detail. FIG. 30 is a perspective view showing the micromachine switch using the piezoelectric effect. In FIG. 30, the micromachine switch comprises: a signal line conductor 2 and earth conductors 3 formed on a substrate 1; a drive shunt mechanism 7 for blocking a passage of a high-frequency signal; and a support 8 provided between the drive shunt mechanism 7 and one of the earth conductors 3. The drive shunt mechanism 7 comprises: a conductive layer 4; a piezoelectric body 5 which is drive means for displacing the drive shunt mechanism 7 when being provided with a control signal; and an elastic body 6. In the case of blocking the high-frequency signal (i.e., in the case of turning off the switch), a voltage is applied to the piezoelectric body 5 as a control signal. As a result, the drive shunt mechanism 7 is displaced downward, and the conductive layer 4 contacts the signal line conductor 2 and the other one of the earth conductors 3. Consequently, the signal line conductor 2 is electrically connected to the other one of the earth conductors 3 via the conductive layer 4, whereby the high-frequency signal is blocked. In the case of passing the high-frequency signal (i.e., in the case of turning on the switch), the application of the voltage to the piezoelectric body 5 is ceased. As a result, the drive shunt mechanism 7 returns to its original state, and the electrical connection between the signal line conductor 2 and the other one of the earth conductors 3 is disconnected, whereby the high-frequency signal passes through the signal line conductor 2.

A micromachine switch using both the piezoelectric effect and the electrostatic effect will be described in detail with reference to FIG. 31. FIG. 31 is a perspective view showing the micromachine switch using both the piezoelectric effect and the electrostatic effect. In FIG. 31, the micromachine switch comprises: an insulated substrate 11; a drive arm 12 provided on the substrate 11; electrostatic electrodes 13 which are respectively provided on the substrate 11 and at a lower surface of the drive arm 12 so as to face each other; first applying means (not shown) for applying a voltage to the electrostatic electrodes 13; a piezoelectric drive electrode 16 provided on an upper surface of the drive arm 12; second applying means (not shown) for applying a voltage to the piezoelectric drive electrode 16; a connection electrode 17 provided at the lower surface of the drive arm 12; and terminal electrodes 18 provided on the substrate 11. The piezoelectric drive electrode 16 has a piezoelectric body layer 14 and two electrodes 15 respectively provided at upper and lower surfaces of the piezoelectric body layer 14. In the case of turning on the switch, voltages are applied to the electrostatic electrodes 13 and to the piezoelectric drive electrode 16 by the first and second applying means. This causes the drive arm 12 to be displaced downward, whereby the connection electrode 17 contacts the terminal electrodes 18. As a result, the terminal electrodes 18 are electrically connected to each other via the connection electrode 17, and a high-frequency signal passes through the terminal electrodes 18 via the connection electrode 17. In the case of turning off the switch, the application of the voltages to the electrostatic electrodes 13 and to the piezoelectric drive electrode 16 is ceased. This causes the drive arm 12 to return to its original state, whereby the electrical connection between the terminal electrodes 18 is disconnected and the high-frequency signal is blocked.

[Patent Document 1] Japanese Laid-Open Patent Publication No. 2003-217421
[Patent Document 2] Japanese Laid-Open Patent Publication No. 2005-302711

SUMMARY OF THE INVENTION

Problems to be Solved by the Invention

In order to perform a switching operation by electrically connecting electrodes, or by disconnecting the electrical connection between the electrodes, there is of course a necessity to form a gap between the electrodes. As shown in FIG. 30, a gap is formed between the conductive layer 4 and the signal line conductor 2, and also between the conductive layer 4 and an earth conductor 3. In FIG. 31, a gap is formed between the connection electrode 17 and each terminal electrode 18. Here, in the case where the micromachine switches as shown in FIGS. 30 and 31 are structured such that these gaps are small, there is a problem that isolation between the electrodes decreases when the switch is turned off. Conversely, in the case where the micromachine switches are structured such that these gaps are wide, the isolation between the electrodes increases. In this case, however, stress concentrates on the support 8 in FIG. 30, and also, stress concentrates on a connecting portion between the drive arm 12 and the substrate 11 in FIG. 31. This causes a problem of deterioration in mechanical reliability.

Thus, it is difficult for conventional micromachine switches to secure both high isolation and mechanical reliability.

Further, in the conventional micromachine switches, flexure of the drive shunt mechanism 7 or of the drive arm 12 is used in a switching operation, and a direction of the flexure is a single direction. For this reason, in order to realize a switch capable of responding to a plurality of inputs/outputs, there is a necessity to use a plurality of micromachine switches. As a result, this causes a problem in that an overall size of the switch increases and a cost of the switch significantly increases.

Therefore, an object of the present invention is to provide a micromachine switch which is capable of securing both high isolation and mechanical reliability.

Another object of the present invention is to provide a micromachine switch which is able to respond to a plurality of inputs/outputs, while preventing a size increase and suppressing a cost increase of the micromachine switch.

Another further object of the present invention is to provide a filter circuit, a duplexer circuit and a communication device, in each of which the micromachine switch of the present invention is used and each of which realizes miniaturization, low loss and high isolation thereof.

Solution to the Problems

The present invention is directed to a micromachine switch which solves the above problems. The present invention is a micromachine switch for switching an electrical connection between signal electrodes in accordance with control signals from outside which include: a first control signal for electrically connecting the signal electrodes between which a signal is to be passed; and a second control signal for disconnecting the electrical connection between the signal electrodes. The micromachine switch comprises: a substrate; a rotating body provided on the substrate, which is rotatable on the substrate; a movable electrode provided on the rotating body; a first signal electrode, one end of which is electrically connected to one end of the movable electrode, and another end of which is provided on the substrate; a second signal electrode which is provided near the rotating body so as to be positioned such that a rotation of the rotating body causes the second signal electrode to be electrically connected to another end of the movable electrode; and a drive section for causing, in accordance with the first control signal, the rotating body to rotate until the rotating body is in such a position as to allow said another end of the movable electrode and the second signal electrode to be electrically connected, and for causing, in accordance with the second control signal, the rotating body to rotate until the rotating body is in such a position as to disconnect an electrical connection between said another end of the movable electrode and the second signal electrode. Note that, the first control signal is equivalent to an ON control signal described in the embodiments provided below, and the second control signal is equivalent to an OFF control signal described in the embodiments. The drive section is, for example, equivalent to a rotation drive section (107, 107a) described below in the embodiments, or equivalent to a combination of the drive section (107, 107a) and a stopper drive section 307. Here, in the structure where the rotating body rotates, not as much stress as in the conventional art concentrates on the rotating body because of its operational characteristics. Accordingly, improved mechanical reliability can be obtained. Further, since the electrical connection between the first and second signal electrodes can be disconnected by the rotation of the rotating body, a sufficiently wide gap can be provided between the movable electrode and the second signal electrode. As a result, sufficiently high isolation can be obtained between the movable electrode and the second signal electrode.

Preferably, a plurality of second signal electrodes are provided in different positions from each other, and the drive section may cause, in accordance with the first control signal, the rotating body to rotate until the rotating body is in such a position as to allow said another end of the movable electrode to be electrically connected to any one of the second signal electrodes. This makes it possible to provide a micromachine switch capable of responding to a plurality of inputs/outputs, while preventing the micromachine switch from becoming large sized. Further, unlike the conventional art, there is no necessity to prepare a number of micromachine switches, the number corresponding to the number of inputs/outputs, and thus an increase in the cost of the micromachine switch can be suppressed.

Preferably, the micromachine switch further comprises a stopper which is movable upward and downward and which is provided so as to be positioned lower than a lower surface of the rotating body, and the rotating body has an incised portion which is formed in accordance with a position and a shape of the stopper. The drive section may cause, in accordance with the first control signal, the rotating body to rotate, and cause the stopper to move so as to be positioned higher than the lower surface of the rotating body. The movable electrode may include a plate-shaped first electrode which is vertically provided on the rotating body, and the second signal electrode may include a plate-shaped second electrode which is vertically provided on the substrate and which is provided in such a position as to be caused to contact the first electrode by the rotation of the rotating body. This allows the rotating body to be mechanically stopped at a desired position. Consequently, errors in switching operations can be eliminated.

Preferably, said another end of the movable electrode may be provided so as to protrude around the rotating body from an outer circumference of the rotating body and so as to be caused by the rotation of the rotating body to overlap an upper surface of the second signal electrode with a gap between said another end and the upper surface. This allows an electrical connection between the first and second signal electrodes to be established by capacitive coupling. As a result, the movable electrode and the second signal electrode do not mechanically contact each other. This prevents frictional wear of the electrodes, which is caused by such a mechanical contact, and also prevents deterioration in characteristics, which is caused by frictional wear of the electrodes.

Preferably, the micromachine switch further comprises: at least one displacement electrode which is provided on the rotating body so as to protrude around the rotating body from the outer circumference of the rotating body; an insulator for connecting the at least one displacement electrode and the movable electrode; and a fixed electrode which is provided on the substrate such that when the rotation of the rotating body causes said another end of the movable electrode to be positioned above the second signal electrode, the fixed electrode faces the at least one displacement electrode. The drive section may cause, in accordance with the first control signal, the rotating body to rotate until said another end of the movable electrode is positioned above the second signal electrode, and when said another end of the movable electrode is positioned above the second signal electrode, the at least one displacement electrode may be displaced in accordance with the first control signal so as to be in such a position as to contact the fixed electrode. Here, since the at least one displacement electrode is connected to the movable electrode via the insulator, said another end of the movable electrode mechanically contacts the second signal electrode in accordance with displacement of the at least one displacement electrode. This allows an electrical connection to be established by a mechanical contact after capacitive coupling is softly performed.

Preferably, the micromachine switch further comprises: two first electrodes which are provided around the rotating body so as to be in such positions as to be symmetrical to the second signal electrode with respect to a rotation axis of the rotating body; and a second electrode which is provided on the rotating body so as to be in such a position as to be symmetrical to the movable electrode with respect to the rotation axis of the rotating body. The second electrode may be provided so as to protrude around the rotating body from an outer circumference of the rotating body and so as to be caused by the rotation of the rotating body to overlap an upper surface of each first electrode with a gap between the second electrode and the upper surface. This enables a detection of a change in capacitance between the second electrode and the two first electrodes. Since a position of the movable electrode can be detected based on the change in the capacitance, more precise switching operations can be performed. More preferably, sizes of the first electrodes may be different from each other. By setting the sizes of the first electrodes to be different from each other, a rotation direction of the rotating body can be detected from the change in the capacitance. As a result, more precise switching operations can be performed.

Preferably, the drive section has: a plurality of pairs of first drive electrodes provided around the rotating body, in each of which pairs, first drive electrodes are formed to have such shapes as to be symmetrical to each other with respect to a rotation axis of the rotating body; and a gear-like shaped second drive electrode which is provided at a lower surface of the rotating body so as to be on a same plane as that of each pair of first drive electrodes. Rotation of the second drive electrode may be caused by an application, in accordance with the first or the second control signal, of a voltage to each pair of first drive electrodes, and the drive section may cause, by the rotation of the second drive electrode, the rotating body to rotate.

Preferably, the drive section has: an elastic body provided below a lower surface of the rotating body; and a piezoelectric body provided at a lower surface of the elastic body. The piezoelectric body may cause, by an application of a voltage corresponding to the first or the second control signal, an elastic traveling wave to be excited on a surface of the elastic body, the surface facing the lower surface of the rotating body, and by causing the elastic traveling wave to be excited, the drive section may cause the rotating body to rotate. More preferably, a plurality of electrodes each having a width of ½ of a wavelength of the elastic traveling wave; an electrode having a width of ¾ of the wavelength of the elastic traveling wave; and an electrode having a width of ¼ of the wavelength of the elastic traveling wave, are formed at a lower surface of the piezoelectric body, and the voltage corresponding to the first or the second control signal may be applied to each of the plurality of electrodes each having the width of ½ of the wavelength of the elastic traveling wave, such that phases of voltages applied to adjacent electrodes among the plurality of electrodes are different by 90 degrees.

The present invention is also directed to a filter circuit. The present invention is a filter circuit for switching a plurality of filters there between, the plurality of filters having different frequency bands from each other. The filter circuit comprises: the micromachine switch according to claim 2; and the plurality of filters which are respectively connected to the plurality of second signal electrodes and which have different frequency bands from each other.

The present invention is also directed to a duplexer circuit. The present invention is a duplexer circuit for switching a plurality of duplexers there between, the plurality of duplexers having different frequency bands from each other. The duplexer circuit comprises: the micromachine switch according to claim 2; and the plurality of duplexers which are respectively connected to the plurality of second signal electrodes and which have different frequency bands from each other.

The present invention is also directed to a communication device. The present invention is a communication device for receiving and transmitting radio signals. The communication device comprises: the duplexer circuit according to claim 13; and a plurality of antennas, respectively connected to the plurality of duplexers via the micromachine switch, for receiving and transmitting the radio signals.

Effect of the Invention

According to the present invention, a micromachine switch, which is capable of securing both high isolation and mechanical reliability, can be provided. Also, according to the present invention, a micromachine switch, which is capable of responding to a plurality of inputs/outputs, can be provided while preventing a size increase and suppressing a cost increase of the micromachine switch. Further, according to the present invention, a filter circuit, a duplexer circuit and a communication device can be provided, in each of which the micromachine switch of the present invention is used and each of which realizes miniaturization, low loss and high isolation thereof.

BRIEF DESCRIPTION OF THE DRAWINGS

FIG. 1A shows an OFF state of a micromachine switch 100 according to a first embodiment.

FIG. 1B shows an ON state of the micromachine switch 100 according to the first embodiment.

FIG. 2 is a cross-sectional view of the micromachine switch 100 cut along a line AA shown in FIG. 1B.

FIG. 3 is a cross-sectional view of the micromachine switch 100 cut along a line BB shown in FIG. 2.

FIG. 4 is a functional block diagram which represents functions of the micromachine switch 100 and a drive circuit 200 for controlling a rotation of a rotating body 102.

FIG. 5A is a top view of a micromachine switch 110.

FIG. 5B is a circuit block diagram of the micromachine switch 110.

FIG. 6A is a top view of a micromachine switch 120 which is structured by connecting a plurality of micromachine switches 110.

FIG. 6B is a circuit block diagram of the micromachine switch 120.

FIG. 7 is a cross-sectional view, cut along the line AA of FIG. 1B, of the micromachine switch 100 having a rotation drive section 107a using the principle of an ultrasonic motor.

FIG. 8 is a perspective view showing the rotation drive section 107a and the rotating body 102 which are disassembled.

FIG. 9A is a perspective view of the rotation drive section 107a which is turned upside down from the state shown in FIG. 8.

FIG. 9B is a front view of a bottom surface of the rotation drive section 107a of FIG. 9A.

FIG. 10A shows an OFF state of a micromachine switch 300 according to a second embodiment.

FIG. 10B shows an ON state of the micromachine switch 300 according to the second embodiment.

FIG. 10C shows an ON state of the micromachine switch 300 according to the second embodiment.

FIG. 11 shows a part of a perspective view of the micromachine switch 300, and shows a cross-sectional view of the part cut along a line CC.

FIG. 12 is a functional block diagram which represents functions of the micromachine switch 300 and a drive circuit 200a for controlling the rotation of the rotating body 102.

FIG. 13A shows an OFF state of a micromachine switch 400 according to a third embodiment.

FIG. 13B shows an ON state of the micromachine switch 400 according to the third embodiment.

FIG. 14 is a cross-sectional view of the micromachine switch 400 cut along a line AA shown in FIG. 13B.

FIG. 15 is a top view of a micromachine switch 410.

FIG. 16A shows an OFF state of a micromachine switch 500 according to a fourth embodiment.

FIG. 16B shows an ON state of the micromachine switch 500 according to the fourth embodiment.

FIG. 17 is a cross-sectional view of the micromachine switch 500 cut along a line AA shown in FIG. 16B.

FIG. 18A shows an OFF state of a micromachine switch 510 which additionally performs an operation for causing a movable electrode 503 and a second signal electrode 505 to mechanically contact each other.

FIG. 18B shows an ON state of the micromachine switch 510 which additionally performs the operation for causing the movable electrode 503 and the second signal electrode 505 to mechanically contact each other.

FIG. 19 is a cross-sectional view of the micromachine switch 510 cut along a line AA shown in FIG. 18B.

FIG. 20A shows an OFF state of a micromachine switch 600 according to a fifth embodiment.

FIG. 20B shows an ON state of the micromachine switch 600 according to the fifth embodiment.

FIG. 21 is a functional block diagram which represents functions of the micromachine switch 600 and a drive circuit 200b for controlling the rotation of the rotating body 102.

FIG. 22 is a top view of a micromachine switch 610.

FIG. 23 shows changes in capacitances, which are detected by a position detection section 601 in the case of having a structure as shown in FIG. 22.

FIG. 24 shows another example of the micromachine switch 610.

FIG. 25 shows changes in capacitances, which are detected by the position detection section 601 in the case of having a structure as shown in FIG. 24.

FIG. 26 shows a circuit structure of a filter circuit 700.

FIG. 27 shows a circuit structure of a filter 720.

FIG. 28 shows a circuit structure of a duplexer circuit 800.

FIG. 29 shows a circuit structure of a communication apparatus 900.

FIG. 30 is a perspective view showing a micromachine switch using the piezoelectric effect.

FIG. 31 is a perspective view showing a micromachine switch using both the piezoelectric effect and the electrostatic effect.

DESCRIPTION OF THE REFERENCE CHARACTERS 100, 110, 120, 300, 400, 410, 500, 510, 600, 610, 701, 801 micromachine switch
101 substrate
102, 302 rotating body
103, 403, 503, 503a movable electrode
104 first signal electrode
105, 105a to 105e, 305a to 305c, 405, 405a, 405b, 505, 505a to 505c second signal electrode
106 spacer
107, 107a rotation drive section
108, 308 switching circuit
109 connection electrode
1071 first drive electrode
1072 second drive electrode
1073, 1074, 1077, 303 protruding body
1075 elastic body
1076 piezoelectric body
306a to 306c stopper
307 stopper drive section
200, 200a, 200b drive circuit
201, 203 voltage applying section
202, 202a, 202b control section
601 position detection section
602 position-detecting movable electrode
603, 603a to 603c position-detecting fixed electrode
700, 720 filter circuit
702, 703, 709 piezoelectric thin-film resonator filter
704 to 708, 805 to 813, 906a, 906b, 907a, 907b terminal
800, 902 duplexer circuit
802a, 802b transmission filter
803a, 803b reception filter
804a, 804b phase circuit
900 communication device
901a, 901b antenna
903a, 903b amplifier
904a, 904b low-noise amplifier
905 baseband section

DETAILED DESCRIPTION OF THE INVENTION

Hereinafter, an embodiment of the present invention will be described with reference to the drawings

First Embodiment

With reference to FIGS. 1A to 3, a micromachine switch 100 according to a first embodiment of the present invention will be described. FIGS. 1A and 1B each show a top view of the micromachine switch 100 according to the first embodiment. FIG. 1A shows an OFF state, and FIG. 1B shows an ON state. FIG. 2 is a cross-sectional view of the micromachine switch 100 cut along a line AA shown in FIG. 1B. FIG. 3 is a cross-sectional view of the micromachine switch 100 cut along a line BB shown in FIG. 2.

First, a structure of the micromachine switch 100 will be described. As shown in FIGS. 1A and 2, the micromachine switch 100 comprises a substrate 101, a rotating body 102, a movable electrode 103, a first signal electrode 104, a second signal electrode 105, a spacer 106 and a rotation drive section 107.

The substrate 101 is formed with a material such as silicon, gallium arsenide, SiC or the like. A circular hollow 101h is formed on the substrate 101. Within the hollow 101h, a disc-shaped rotating body 102 is provided in a rotatable manner. On the rotating body 102, a movable electrode 103 is provided. The first signal electrode 104 is an electrode through which, e.g., a high-frequency signal, for which switching is performed, passes. One end of the first signal electrode 104 is provided on one end of the movable electrode 103 so as to be electrically connected to the movable electrode 103. Further, said one end of the first signal electrode 104 fixes the rotating body 102 and the movable electrode 103 in a rotatable manner. The other end of the first signal electrode 104 is provided on the substrate 101, having the spacer 106 interposed between the first signal electrode 104 and the substrate 101. The second signal electrode 105 is an electrode through which, e.g., a high-frequency signal, for which switching is performed, passes. The second signal electrode 105 is provided on the substrate 101 so as to be positioned near the hollow 101h. A side surface of the movable electrode 103 and a side surface of the second signal electrode 105, which side surface of the second signal electrode 105 is adapted to face the side surface of the movable electrode 103, contact each other or do not contact each other in accordance with a rotation of the rotating body 102.

As shown in FIG. 2, the rotation drive section 107 comprises a first drive electrode 1071, a second drive electrode 1072, a protruding body 1073 and protruding bodies 1074. The first drive electrode 1071 is formed within the substrate 101. As shown in FIG. 3, the first drive electrode 1071 comprises six electrodes 1071a to 1071f. The electrode 1071a and the electrode 1071d are formed into such shapes as to be symmetrical to each other with respect to a rotation axis of the second drive electrode 1072. The same is true for the electrodes 1071b and 1071e and for the electrodes 1071c and 1071f. Thus, the electrodes 1071a and 1071d, the electrodes 1071b and 1071e, and the electrodes 1071c and 1071f, are pairs of electrodes, respectively. Hereinafter, these pairs of electrodes are referred to as pairs of first drive electrodes. The second drive electrode 1072 is formed at a lower surface of the rotating body 102. The second drive electrode 1072 seen from above is, as shown in FIG. 3, in a gear-like shape. The second drive electrode 1072, is positioned on a same plane as that of the first drive electrode 1071. The protruding body 1073 is provided at the center of a lower surface of the second drive electrode 1072. A plurality of protruding bodies 1074 are provided at peripheral portions of the lower surface of the second drive electrode 1072. The protruding bodies 1073 and 1074 are provided for supporting the rotating body 102 and the second drive electrode 1072 in a rotatable manner, and are not fixed to the substrate 101.

Described below is a principle in which a rotation drive force, for causing the rotating body 102 to rotate in the rotation drive section 107, is generated. In order to generate the rotation drive force, voltages, which are different from each other in phase, may be applied to the three pairs of first drive electrodes, respectively. To be specific, pulse voltages, which are different from each other in phase by 120 degrees, are applied to the three pairs of first drive electrodes, respectively. As a result, electrostatic force is generated between the second drive electrode 1072 and each of the three pairs of first drive electrodes. This generated electrostatic force is the rotation drive force which causes the second drive electrode 1072 and the rotating body 102 to rotate. Note that, by changing a phase relationship among the voltages respectively applied to the three pairs of first drive electrodes, a direction of the rotation can be set to an arbitrary direction. Further, when the application of the pulse voltages is ceased, the electrostatic force disappears, and the rotating body 102 stops rotating, accordingly.

Next, with reference to FIGS. 1A and 1B, switching operations of the above-structured micromachine switch 100 will be described. The micromachine switch 100 performs the switching operations by causing the rotating body 102 to rotate. Hereinafter, a specific description of a case where the switch is turned on and a specific description of a case where the switch is turned off are given separately. It is assumed in the descriptions below that the OFF state shown in FIG. 1A is an initial state. In FIG. 1A, the movable electrode 103 is, when described using a clock face, present in the position of 9 o'clock.

In the case of turning on the switch by electrically connecting the movable electrode 103 and the second signal electrode 105, the rotating body 102 rotates clockwise (in a direction indicated by a dotted arrow shown in FIG. 1A) from a state where the movable electrode 103 is in the position of 9 o'clock, and then stops when the movable electrode 103 arrives at the position of 12 o'clock. To be specific, voltages start to be applied to the respective pairs of first drive electrodes in accordance with an ON control signal provided from outside, whereby a clockwise rotation drive force is generated at the rotation drive section 107. An effect of this rotation drive force causes the rotating body 102 to rotate clockwise. Thereafter, when the movable electrode 103 arrives at the position of 12 o'clock, the application of the voltages to the respective pairs of first drive electrodes is ceased in accordance with the ON control signal from outside. As a result, as shown in FIGS. 1B and 2, the movable electrode 103 is electrically connected to the second signal electrode 105, and the micromachine switch 100 enters the ON state. The ON control signal provided from outside will be described later.

On the other hand, in the case of turning off the switch by disconnecting the electrical connection between the movable electrode 103 and the second signal electrode 105, the rotating body 102 rotates counterclockwise (in a direction indicated by a dotted arrow shown in FIG. 1B) from a state where the movable electrode 103 is in the position of 12 o'clock, and then stops when the movable electrode 103 arrives at the position of 9 o'clock. To be specific, voltages start to be applied to the respective pairs of first drive electrodes in accordance with an OFF control signal provided from outside, whereby a counterclockwise rotation drive force is generated at the rotation drive section 107. An effect of the rotation drive force causes the rotating body 102 to rotate counterclockwise. Thereafter, when the movable electrode 103 arrives at the position of 9 o'clock, the application of the voltages to the respective pairs of first drive electrodes is ceased in accordance with the OFF control signal from outside. As a result, as shown in FIG. 1A, the electrical connection between the movable electrode 103 and the second signal electrode 105 is disconnected, and the micromachine switch 100 enters the OFF state. The OFF control signal provided from outside will be described later.

As described above, the micromachine switch 100 performs switching operations by causing the rotating body 102 to rotate. Here, unlike the conventional art, concentration of stress is not caused in the above-described structure for causing the rotation of the rotating body 102, because of its structure. Accordingly, mechanical reliability can be improved as compared to the conventional art. Further, in the OFF state, a sufficiently large distance can be secured between the movable electrode 103 and the second signal electrode 105, whereby high isolation is obtained there between.

Hereinafter, a method for controlling the rotation of the rotating body 102 will be described in detail with reference to FIG. 4. FIG. 4 is a functional block diagram which represents functions of the micromachine switch 100 and a drive circuit 200 for controlling the rotation of the rotating body 102. In FIG. 4, the micromachine switch 100 comprises the rotation drive section 107 and a switch circuit 108. The switch circuit 108 comprises the rotating body 102, the movable electrode 103, the first signal electrode 104 and the second signal electrode 105. An outlined arrow shown in FIG. 4 represents the rotation drive force with which the rotation drive section 107 causes the rotating body 102 of the switch circuit 108 to rotate. The drive circuit 200 comprises a voltage applying section 201 and a control section 202. It is assumed here that the drive circuit 200 is an individual unit which is formed by integration of semiconductor devices. Based on an ON control signal or OFF control signal provided from the control section 202, the voltage applying section 201 applies, to the respective pairs of first drive electrodes, voltages which are different in phase from each other.

The control section 202 controls a rotation direction and a rotation amount of the rotating body 102. To be specific, in the case of turning on the switch, the control section 202 outputs the ON control signal to the voltage applying section 201. The ON control signal contains phase information indicating a phase relationship among the voltages to be applied to the respective pairs of first drive electrodes, and contains application time information indicating a time (application time) during which the voltages are to be applied to the respective pairs of first drive electrodes. As one example, it is assumed here that the phase information indicates a phase relationship which causes the rotation direction of the rotating body 102 to be clockwise, and that the application time information indicates a time which is required for the rotating body 102 to rotate by 90 degrees. Based on the ON control signal, the voltage applying section 201 applies the voltages to the respective pairs of first drive electrodes in accordance with the phase relationship indicated by the phase information and for the application time indicated by the application time information. As a result, the rotating body 102 rotates clockwise by 90 degrees from the state where the movable electrode 103 is in the position of 9 o'clock, and stops when the movable electrode 103 arrives at the position of 12 o'clock.

On the other hand, in the case of turning off the switch, the control section 202 outputs the OFF control signal to the voltage applying section 201. Similarly to the ON control signal, the OFF control signal contains the phase information and the application time information. As one example, it is assumed here that the phase information indicates a phase relationship which causes the rotation direction of the rotating body 102 to be counterclockwise, and that the application time information indicates the time which is required for the rotating body 102 to rotate by 90 degrees. Thus, the OFF control signal is different from the ON control signal with respect to the phase information. Based on the OFF control signal, the voltage applying section 201 applies the voltages to the Respective pairs of first drive electrodes in accordance with the phase relationship indicated by the phase information and for the application time indicated by the application time information. As a result, the rotating body 102 rotates counterclockwise by 90 degrees from the state where the movable electrode 103 is in the position of 12 o'clock, and stops when the movable electrode 103 arrives at the position of 9 o'clock.

As described above, the switching operations of the micromachine switch 100 are performed in accordance with the ON control signal and the OFF control signal provided from the control section 202. Since the ON control signal and the OFF control signal each indicate a state of the application of the voltages, the switching operations of the micromachine switch 100 are realized by a simple control.

Note that, in the above description, the number of second signal electrodes 105 provided on the substrate 101 is 1. However, the present invention is not limited thereto. A plurality of second signal electrodes 105 may be provided on the substrate 101 as shown in FIG. 5A. FIG. 5A shows a top view of a micromachine switch 110. A structure of the micromachine switch 110 is different from that of the micromachine switch 100 only in that second signal electrodes 105a to 105e are formed instead of the second signal electrode 105. Therefore, components of the micromachine switch 110 other than these are denoted by the same reference numerals as those used for the micromachine switch 100, and descriptions of the components will be omitted. As shown in FIG. 5A, the second signal electrodes 105a to 105e are respectively provided at different positions from each other around the rotating body 102. FIG. 5B is a circuit block diagram of the micromachine switch 110. As shown in FIG. 5B, the second signal electrodes 105a to 105e are equivalent to a plurality of inputs (or outputs).

Next, switching operations of the micromachine switch 110 will be described. In the micromachine switch 110, the movable electrode 103 is always electrically connected to any one of the second signal electrodes 105a to 105e. In other words, the micromachine switch 110 is always in the ON state. In the micromachine switch 110, which one of the second signal electrodes 105a to 105e the movable electrode 103 is to be connected to is determined by controlling the rotation direction and rotation amount of the rotating body 102. In other words, the control section 202 may output a plurality of types of ON control signals respectively corresponding to the second signal electrodes 105a to 105e. As one example, a state where the movable electrode 103 is connected to the second signal electrode 105a is set as an initial state of the control section 202. Also, rotation amounts of rotations from the initial state to the second signal electrodes 105b to 105e are respectively preset in the control section 202. By referring to the rotation amount of the rotation from the second signal electrode 105a to a second signal electrode to which the movable electrode 103 is currently connected, and referring to the rotation amount of the rotation from the second signal electrode 105a to a second signal electrode to which the movable electrode 103 is to be connected next, the control section 202 can obtain the rotation direction and rotation amount of the rotation from the second signal electrode, to which the movable electrode 103 is currently connected, to the second signal electrode to which the movable electrode 103 is to be connected next. This allows the control section 202 to output a plurality of types of ON control signals which are different from each other in the rotation direction and in the rotation amount. As a result, the rotation drive section 107 is able to cause, in accordance with an ON control signal from the control section 202, the rotating body 102 to rotate so as to be in such a position as to allow the movable electrode 103 to be electrically connected to a desired second signal electrode.

By using such a structure as that of the micromachine switch 110, a micromachine switch, which is able to respond to a plurality of inputs/outputs, can be provided while preventing the micromachine switch from becoming large sized. Further, there is no necessity to prepare a number of micromachine switches, the number corresponding to the number of inputs/outputs, and thus an increase in the cost of the micromachine switch can be suppressed.

Note that, in FIG. 5A, during a process where the rotating body 102 rotates clockwise and the movable electrode 103 is electrically connected to the second signal electrode 105c, the movable electrode 103 once contacts the second signal electrode 105b. In order to avoid this contact, the micromachine switch 110 may be further provided with a lifting drive section (not shown) for lifting up and down the rotating body 102. In this case, the drive circuit 200 further comprises, in addition to the voltage applying section 201, a voltage applying section (not shown) for applying a voltage to the lifting drive section. The control section 202 outputs, to the voltage applying section for applying a voltage to the lifting drive section, a first ON control signal containing ascending information indicating that the rotating body 102 is to be caused to ascend, and thereafter, outputs, to the voltage applying section 201, a second ON control signal containing the phase information and the application time information. After the rotating body 102 stops, the control section 202 outputs, to the voltage applying section for applying a voltage to the lifting drive section, a third ON control signal containing descending information indicating that the rotating body 102 is to be caused to descend. As a result, the lifting drive section causes the rotating body 102 to ascend, and after the rotating body 102 has ascended, the rotation drive section 107 causes the rotating body 102 to rotate, and after the rotating body 102 has rotated, the lifting drive section causes the rotating body 102 to descend. This consequently allows switching operations to be performed without causing the movable electrode 103 to electrically connect to an undesired electrode, e.g., the second signal electrode 105b.

Note that, as shown in FIG. 6A, a plurality of micromachine switches 110 as described above may be connected. FIG. 6A is a top view of a micromachine switch 120 which is structured by connecting a plurality of micromachine switches 110. As shown in FIG. 6A, the micromachine switch 120 is structured by connecting two micromachine switches 110 via a connection electrode 109. FIG. 6B is a circuit block diagram of the micromachine switch 120. By having such a structure as shown in FIGS. 6A and 6B, switching for both inputs and outputs can be performed. Accordingly, in the case where the micromachine switch 120 is used in a multi-mode or multi-band mobile phone, the single switch can perform antenna switching and filter switching. As a result, a great effect can be obtained in terms of miniaturization.

Note that, in the above description, the rotation drive section 107 is structured so as to use the electrostatic force. However, the rotation drive section 107 may be structured so as to use the principle of an ultrasonic motor. Described below with reference to FIGS. 7 to 9B is a structure of a rotation drive section 107a in the case where the principle of an ultrasonic motor is used. FIG. 7 is a cross-sectional view, cut along the line AA of FIG. 1B, of the micromachine switch 100 having the rotation drive section 107a using the principle of an ultrasonic motor. FIG. 8 is a perspective view showing the rotation drive section 107a and the rotating body 102 which are disassembled. FIG. 9A is a perspective view of the rotation drive section 107a which is turned upside down from the state shown in FIG. 8. FIG. 9B is a front view of a bottom surface of the rotation drive section 107a of FIG. 9A. Note that, the micromachine switch 100 shown in FIGS. 7 to 9B is different from that shown in FIGS. 1A and 2, only in that the rotation drive section 107 is replaced with the rotation drive section 107a. Therefore, components other than the rotation drive section 107a are denoted by the same reference numerals as those used in FIGS. 1A and 2, and descriptions of the components will be omitted.

As shown in FIGS. 7 and 8, the rotation drive section 107a is provided at a lower surface of the rotating body 102. The rotation drive section 107a comprises an elastic body 1075, a piezoelectric body 1076, the protruding body 1073, the protruding bodies 1074 and protruding bodies 1077. Similarly to the rotating body 102, the elastic body 1075 is circular-shaped. A plurality of protruding bodies 1077 are provided on peripheral portions of an upper surface of the elastic body 1075. The protruding body 1073 is provided at the center of a lower surface of the elastic body 1075. The piezoelectric body 1076 is ring-shaped. As shown in FIGS. 7 and 9A, the plurality of protruding bodies 1074 are provided at a lower surface of the piezoelectric body 1076. Further, electrodes A1 to A16 and electrodes C1 and C2 are formed at the lower surface of the piezoelectric body 1076, as shown in FIG. 9B. It is assumed here that polarization directions at respective portions of the piezoelectric body 1076, on which respective portions the electrodes A1 to A16 are formed, are different from each other. In FIG. 9B, for example, when the polarization directions of the electrodes A1, A3, A5, A7, A9, A11, A13 and A15 (herein after, referred to as a first electrode group) are in a positive Z-axis direction, the polarization directions of the other electrodes A2, A4, A6, A8, A10, A12, A14 and A16 (herein after, referred to as a second electrode group) are in a negative Z-axis direction. By applying voltages, which are different in phase by 90 degrees, to the first electrode group and the second electrode group, respectively, the piezoelectric body 1076 expands and contracts. As a result, high-order bending vibration is generated on the upper surface of the elastic body 1075, and an elastic traveling wave is excited. At this point, the protruding bodies 1077 provided on the upper surface of the elastic body 1075 give a rotation drive force to the rotating body 102, and the rotating body 102 rotates in an opposite direction to that of a traveling direction of the elastic traveling wave. Note that, when the application of the voltages to the piezoelectric body 1076 is ceased, the vibration of the elastic body 1075 also ceases immediately and the rotating body 102 stops rotating.

Note that a width, in a circumferential direction, of each of the electrodes A1 to A16 is equivalent to ½ of a wavelength of the elastic traveling wave excited on the upper surface of the elastic body 1075. Also, a width, in the circumferential direction, of the electrode C1 is equivalent to ¼ of the wavelength, and a width, in the circumferential direction, of the electrode C2 is equivalent to ¾ of the wavelength. Further, the protruding bodies 1073 and 1074 are not fixed to the substrate 101.

Even in the case of adopting the rotation drive section 107a using the principle of an ultrasonic motor, the control section 202 can control the rotation direction by controlling the traveling direction of the traveling wave by using the phase information, and control the rotation amount by using the application time information.

As described above, in the case of having such a structure as that of the rotation drive section 107a which uses the principle of an ultrasonic motor, when the application of the voltages to the piezoelectric body 1076 starts, the rotating body 102 starts rotating immediately, and when the application of the voltages to the piezoelectric body 1076 is ceased, the rotating body 102 stops rotating immediately. Thus, in the switching operations, the rotation of the rotating body 102 can be started or ceased instantaneously. Further, in the case of using the principle of an ultrasonic motor, the amount of displacement of the rotation drive section 107a is smaller as compared to the conventional art, and therefore, concentration of stress is reduced. This consequently provides an effect in which a high mechanical reliability is obtained. Further, stress concentration is dispersed to multiple positions depending on vibration modes. Also for this reason, an effect is provided, in which a higher mechanical reliability than the conventional art is obtained.

Although the above description describes that the drive circuit 200 is an individual unit which is formed by integration of semiconductor devices, the present invention is not limited thereto. For example, when the micromachine switch 100 is used for a transmission unit or receiving unit of a mobile phone, there is a case where switching operations are performed at input/output timings of transmission signals or reception signals. In such a case, it is desired that the drive circuit 200 is not an individual unit but integrated with a circuit unit within the mobile phone. Also, when the micromachine switch 100 is used for a transmission unit or receiving unit of a mobile phone, there is a case where a switching operation is performed in accordance with a load change of a power amplifier or the like. In the case of performing a switching operation in accordance with a load change of a power amplifier or the like, it is desired to detect a signal of a control unit of the power amplifier to cause the switch to operate. Also in this case, it is desired that the drive circuit 200 is not an individual unit but integrated with a circuit unit within the mobile phone. Further, the control section 202 can be structured with a microcomputer or the like. When the control section 202 is structured with a microcomputer or the like, a further advantage is obtained in terms of miniaturization of the drive circuit 200.

Second Embodiment

A micromachine switch 300 according to a second embodiment of the present invention will be described with reference to FIGS. 10A to 12. FIGS. 10A to 10C are top views of the micromachine switch 300 according to the second embodiment. FIG. 10A shows an OFF state. FIGS. 10B and 10C each show an ON state. FIG. 11 shows a perspective view of a part of the micromachine switch 300, and shows a cross-sectional view of the part cut along a line CC. FIG. 12 is a functional block diagram which represents functions of the micromachine switch 300 and a drive circuit 200a for controlling the rotation of the rotating body 102.

First, a structure of the micromachine switch 300 will be described. In FIGS. 10A to 12, the micromachine switch 300 comprises the substrate 101, a rotating body 302, the movable electrode 103, the first signal electrode 104, second signal electrodes 305a to 305c, the spacer 106, the rotation drive section 107, stoppers 306a to 306c, a protruding body 303 and a stopper drive section 307. Note that, the micromachine switch 300 is different from the micromachine switch 100 described in the first embodiment in that: the second signal electrode 105 is replaced with the second signal electrodes 305a to 305c; the rotating body 102 is replaced with the rotating body 302; the micromachine switch 300 further comprises the protruding body 303, the stoppers 306a to 306c and the stopper drive section 307; and the rotation drive section 107 is placed within the substrate 101. Components of the micromachine switch 300 other than the second signal electrodes 305a to 305c, the rotating body 302, the stoppers 306a to 306c, the protruding body 303 and the stopper drive section 307, are the same as those of the micromachine switch 100 and denoted by the same reference numerals as those used for the micromachine switch 100. Therefore, descriptions of the components will be omitted.

The rotating body 302 has a circular shape on which a plurality of incised portions are formed, and the rotating body 302 is placed within the hollow 101h formed on the substrate 101. In the example of FIG. 11, the rotation drive section 107 is placed within the substrate 101. The protruding body 303 is provided at the center of a lower surface of the rotating body 302. The rotating body 302 is connected to the rotation drive section 107 via the protruding body 303. The second signal electrodes 305a to 305c are provided on the substrate 101 so as to be positioned around the hollow 101h. A side surface of the movable electrode 103 and a side surface of each of the second signal electrodes 305a to 305c, which side surface of each of the second signal electrodes 305a to 305c is adapted to face the side surface of the movable electrode 103, contact each other or do not contact each other in accordance with a rotation of the rotating body 302. The stoppers 306a to 306c are, as shown in FIG. 10A, placed within the hollow 101h formed on the substrate 101. The stoppers 306a to 306c are placed in the order of stopper 306a, stopper 306b and stopper 306c, in a radial direction from a rotation axis of the rotating body 302. Further, as shown in FIG. 11, the stoppers 306a to 306c are provided, in such positions as to contact the substrate 101, so as to be lower than the lower surface of the rotating body 302 and so as to be movable up and down. Still further, as shown in FIG. 11, a thickness, in a height direction, of each of the stoppers 306a to 306c is smaller than a gap between the lower surface of the rotating body 302 and an upper surface of the substrate 101. The stopper drive section 307 generates, when a voltage is applied thereto from outside, a drive force for causing the stoppers 306a to 306c to move up and down. Although the stopper drive section 307 is not shown here, the stopper drive section 307 is placed within the substrate 101, for example. Note that, the incised portions on the rotating body 302 are formed in accordance with the positions and shapes of the stoppers 306a to 306c.

Next, with reference to FIGS. 10A to 10C, switching operations of the above-structured micromachine switch 300 will be described. The micromachine switch 300 performs the switching operations by causing the rotating body 302 to rotate. Hereinafter, a specific description of a case where the switch is turned on and a specific description of a case where the switch is turned off are given separately. It is assumed in the descriptions below that the OFF state shown in FIG. 10A, in which the movable electrode 103 is in the position of 9 o'clock, is an initial state. In FIG. 10A, all the stoppers 306a to 306c are positioned so as to contact the substrate 101. In the descriptions below, among the stoppers 306a to 306c, the one which is positioned so as to contact the substrate 101 is diagonally hatched, and the one which is positioned to be higher than the lower surface of the rotating body 302 is not hatched, in order to facilitate the understanding of the descriptions.

In the case of turning on the switch by electrically connecting the movable electrode 103 and the second signal electrode 305a, the rotating body 302 rotates clockwise (in a direction indicated by a dotted arrow shown in FIG. 10A) from a state where the movable electrode 103 is in the position of 9 o'clock, and stops when the movable electrode 103 arrives at such a position as to be electrically connected to the second signal electrode 305a. To be specific, voltages start to be applied to the respective pairs of first drive electrodes of the rotation drive section 107 in accordance with an ON control signal from outside, whereby the rotating body 102 rotates clockwise. Concurrently with this rotation, a voltage is applied to the stopper drive section 307 in accordance with an ON control signal from outside. The stopper 306a moves from the position at which the stopper 306a contacts the substrate 101, so as to be positioned higher than the lower surface of the rotating body 302. As a result, the stopper 306a contacts an incised portion of the rotating body 302, which incised portion corresponds to the stopper 306a. Consequently, as shown in FIG. 10B, the rotating body 302 mechanically stops at such a position as to allow the movable electrode 103 to be electrically connected to the second signal electrode 305a.

Thereafter, in the case of turning on the switch by electrically connecting the movable electrode 103 to the second signal electrode 305b, a voltage is applied to the stopper drive section 307 in accordance with an ON control signal from outside, and the stopper 306a moves so as to be positioned lower than the lower surface of the rotating body 302, and the stopper 306b moves from the position, at which the stopper 306b contacts the substrate 101, so as to be positioned higher than the lower surface of the rotating body 302. At this point, the effect of the rotation drive force is still continuing to be exerted on the rotating body 302. Therefore, the rotating body 302 rotates clockwise (in a direction indicated by a dotted arrow shown in FIG. 10B) until the stopper 306b contacts an incised portion of the rotating body 302, which incised portion corresponds to the stopper 306b. Accordingly, the movable electrode 103 is electrically connected to the second signal electrode 305b. FIG. 11 shows a perspective view and a cross-sectional view of this state.

On the other hand, in the case of turning off the switch by returning the movable electrode 103 to the original position (i.e., the position of 9 o'clock), the rotating body 302 rotates counterclockwise (in a direction indicated by a dotted arrow shown in FIG. 10C) from a state where the movable electrode 103 is in the position of 12 o'clock, and stops when the movable electrode 103 arrives at the position of 9 o'clock. To be specific, voltages start to be applied to the respective pairs of first drive electrodes of the rotation drive section 107 in accordance with an OFF control signal from outside, whereby the rotating body 302 rotates counterclockwise. Thereafter, when the movable electrode 103 arrives at the position of 9 o'clock, the application of the voltages to the respective pairs of first drive electrodes of the rotation drive section 107 is ceased in accordance with the OFF control signal from outside.

Hereinafter, with reference to FIG. 12, a method for controlling the rotation of the rotating body 302 will be described in detail. As shown in FIG. 12, the micromachine switch 300 comprises the rotation drive section 107, the stopper drive section 307 and a switching circuit 308. The switching circuit 308 comprises the rotating body 302, the movable electrode 103, the first signal electrode 104, the second signal electrodes 305a to 305c, the protruding body 303 and the stoppers 306a to 306c. An outlined arrow from the rotation drive section 107 to the switching circuit 308 shown in FIG. 12 represents a rotation drive force with which the rotation drive section 107 causes the rotating body 302 of the switch circuit 308 to rotate. An outline arrow from the stopper drive section 307 to the switching circuit 308 shown in FIG. 12 represents a drive force with which the stopper drive section 307 causes the stoppers 306a to 306c of the switch circuit 308 to move. The drive circuit 200a comprises the voltage applying section 201, a control section 202a and a voltage applying section 203. It is assumed here that similarly to the drive circuit 200, the drive circuit 200a is formed as an individual unit by integration of semiconductor devices. Based on an OFF control signal or a first ON control signal provided from the control section 202a, the voltage applying section 201 applies, to the respective pairs of first drive electrodes, voltages which are different in phase from each other. Based on a second ON control signal provided from the control section 202a, the voltage applying section 203 applies a voltage to the stopper drive section 307.

The control section 202a controls a rotation direction and a rotation amount of the rotating body 302. To be specific, in the case of turning on the switch by electrically connecting the movable electrode 103 and the second signal electrode 305a, the control section 202a outputs the first ON control signal to the voltage applying section 201, and outputs the second ON control signal to the voltage applying section 203. The first ON control signal outputted to the voltage applying section 201 only contains phase information indicating a phase relationship among the voltages to be applied to the respective pairs of first drive electrodes of the rotation drive section 107. It is assumed that the phase information herein indicates a phase relationship which causes the rotation direction of the rotating body 302 to be clockwise. The voltage applying section 201 applies the voltages to the respective pairs of first drive electrodes of the rotation drive section 107 in accordance with the phase relationship indicated by the phase information contained in the first ON control signal. The second ON control signal outputted to the voltage applying section 203 contains stopper information which specifies any one of the stoppers 306a to 306c. It is assumed that the stopper information herein specifies the stopper 306a. Based on the second ON control signal, the voltage applying section 203 applies the voltage to the stopper drive section 307. In this manner, the rotation drive section 107 causes the rotating body 302 to rotate clockwise from the state where the movable electrode 103 is in the position of 9 o'clock. At the same time, the stopper drive section 307 causes the stopper 306a to move from the position, at which the stopper 306a contacts the substrate 101, so as to be positioned higher than the lower surface of the rotating body 302. As a result, the stopper 306a contacts the incised portion of the rotating body 302, which incised portion corresponds to the stopper 306a. Consequently, the rotating body 302 mechanically stops at such a position as to allow the movable electrode 103 to be electrically connected to the second signal electrode 305a.

Thereafter, in the case of turning on the switch by electrically connecting the movable electrode 103 and the second signal electrode 305b, the control section 202a outputs the third ON control signal to the voltage applying section 203. It is assumed that the stopper information contained in the third ON control signal herein specifies the stopper 306b. Based on the third ON control signal, the voltage applying section 203 applies the voltage to the stopper drive section 307. As a result, the stopper drive section 307 causes the stopper 306a to move so as to be positioned lower than the lower surface of the rotating body 302, and causes the stopper 306b to move from the position, at which the stopper 306b contacts the substrate 101, so as to be positioned higher than the lower surface of the rotating body 302. Consequently, since the effect of the rotation drive force is still continuing to be exerted on the rotating body 302, the rotating body 302 rotates clockwise (in the direction indicated by the dotted arrow shown in FIG. 10B) until the stopper 306b contacts the incised portion of the rotating body 302, which incised portion corresponds to the stopper 306b, and then the movable electrode 103 is electrically connected to the second signal electrode 305b.

On the other hand, in the case of turning off the switch by returning the movable electrode 103 to the original position (position of 9 o'clock), the control section 202a outputs the OFF control signal to the voltage applying section 201. The OFF control signal contains the phase information and the application time information. It is assumed that the phase information herein indicates a phase relationship which causes the rotation direction of the rotating body 302 to be counterclockwise, and the application time information indicates a time which is required for the rotating body 302 to rotate by 90 degrees. The voltage applying section 201 applies a voltage to the rotation drive section 107 in accordance with the phase relationship indicated by the phase information contained in the OFF control signal and for the application time indicated by the application time information contained in the OFF control signal. As a result, the rotating body 302 rotates counterclockwise from the state where the movable electrode 103 is in the position of 12o' clock, and stops when the movable electrode 103 arrives at the position of 9 o'clock.

As described above, according to the present embodiment, in the case of turning on the switch, the rotating body 302 can be mechanically stopped by the stoppers 306a to 306c. This allows a switching operation to be performed at a desired position even if the rotation drive force continues to be applied to the rotating body 302. Further, the rotating body can be stopped at arbitrary positions by setting, as desired, the positions of the stoppers 306a to 306c and the positions of the incisions on the rotating body 302. Still further, since the rotating body 302 can be mechanically stopped by the stoppers 306a to 306c, switching operations with a small amount of errors can be realized in performing multiple switching operations.

Third Embodiment

With reference to FIGS. 13A to 14, a micromachine switch 400 according to a third embodiment of the present invention will be described. FIGS. 13A and 13B are top views of the micromachine switch 400 according to the third embodiment. FIG. 13A shows an OFF state, and FIG. 13B shows an ON state. FIG. 14 is a cross-sectional view of the micromachine switch 400 cut along a line AA shown in FIG. 13B.

First, a structure of the micromachine switch 400 will be described. As shown in FIGS. 13A to 14, the micromachine switch 400 comprises the substrate 101, the rotating body 102, a movable electrode 403, the first signal electrode 104, a second signal electrode 405, the spacer 106 and the rotation drive section 107. Note that, the micromachine switch 400 is different from the micromachine switch 100 described in the first embodiment in that the movable electrode 103 is replaced with the movable electrode 403 and the second signal electrode 105 is replaced with the second signal electrode 405. Components of the micromachine switch 400 other than the movable electrode 403 and the second signal electrode 405 are the same as those of the micromachine switch 100, and denoted by the same reference numerals as those used for the micromachine switch 100. Therefore, descriptions of the components will be omitted.

The movable electrode 403 comprises electrodes 4031 and 4032. The electrode 4031 has the same shape as that of the above-described movable electrode 103, and is formed on the rotating body 102. The electrode 4032 is plate-shaped as shown in FIGS. 13A and 14, and is vertically provided on the electrode 4031. The second signal electrode 405 comprises electrodes 4051 and 4052. The electrode 4051 has the same shape as that of the second signal electrode 105, and is provided on the substrate 101 so as to be positioned near the hollow 101h. The electrode 4052 is plate-shaped as shown in FIGS. 13A and 14, and is vertically provided on the electrode 4051. The electrode 4032 of the movable electrode 403 and the electrode 4052 of the second signal electrode 405 are positioned such that the electrode 4032 and the electrode 4052 contact or do not contact each other in accordance with the rotation of the rotating body 102.

Next, with reference to FIGS. 13A and 13B, switching operations of the above-structured micromachine switch 400 will be described. The micromachine switch 400 performs switching operations by causing the rotating body 102 to rotate. Hereinafter, a specific description of a case where the switch is turned on and a specific description of a case where the switch is turned off are given separately. It is assumed in the descriptions below that the OFF state shown in FIG. 13A is an initial state. In FIG. 13A, the movable electrode 403 is in the position of 9 o'clock.

In the case of turning on the switch by electrically connecting the movable electrode 403 and the second signal electrode 405, the rotating body 102 rotates clockwise (in a direction indicated by a dotted arrow shown in FIG. 13A) from a state where the movable electrode 403 is in the position of 9 o'clock. To be specific, voltages start to be applied to the respective pairs of first drive electrodes of the rotation drive section 107 in accordance with an ON control signal from outside, whereby the rotating body 102 rotates clockwise. When the movable electrode 403 arrives at the position of 12 o'clock, the electrode 4032 of the movable electrode 403 contacts the electrode 4052 of the second signal electrode 405, whereby the rotating body 102 stops rotating. As a result, as shown in FIG. 13B, the movable electrode 403 is electrically connected to the second signal electrode 405, and the micromachine switch 400 enters the ON state.

On the other hand, in the case of turning off the switch by disconnecting the electrical connection between the movable electrode 403 and the second signal electrode 405, the rotating body 102 rotates counterclockwise (in a direction indicated by a dotted arrow shown in FIG. 13B) from a state where the movable electrode 403 is in the position of 12 o'clock, and stops when the movable electrode 403 arrives at the position of 9 o'clock. To be specific, voltages start to be applied to the respective pairs of first drive electrodes of the rotation drive section 107 in accordance with an OFF control signal from outside, whereby the rotating body 102 rotates counterclockwise. Thereafter, when the movable electrode 403 arrives at the position of 9 o'clock, the application of the voltages to the respective pairs of first drive electrodes of the rotation drive section 107 is ceased in accordance with the OFF control signal from outside. As a result, as shown in FIG. 13A, the electrical connection between the movable electrode 403 and the second signal electrode 405 is disconnected, and the micromachine switch 400 enters the OFF state.

Hereinafter, a method for controlling the rotation of the rotating body 102 will be described in detail. A functional block diagram, which represents functions of the micromachine switch 400 and the drive circuit 200 for controlling the rotation of the rotating body 102, is equivalent to a result of replacing the micromachine switch 100 of FIG. 4 with the micromachine switch 400. The control method in the present embodiment is different from the control method described with reference to FIG. 4, only for the case where the switch is turned on.

In the case of turning on the switch, the control section 202 outputs the ON control signal to the voltage applying section 201. The ON control signal only contains phase information indicating a phase relationship among the voltages to be applied to the respective pairs of first drive electrodes of the rotation drive section 107. It is assumed that the phase information herein indicates a phase relationship which causes the rotation direction of the rotating body 102 to be clockwise. Based on the ON control signal, the voltage applying section 201 applies the voltages to the rotation drive section 107 in accordance with the phase relationship indicated by the phase information. This causes the rotating body 102 to rotate clockwise from the state where the movable electrode 403 is in the position of 9 o'clock. Here, when the movable electrode 403 arrives at the position of 12 o'clock, the electrode 4032 of the movable electrode 403 contacts the electrode 4052 of the second signal electrode 405. As a result, the rotation of the rotating body 102 mechanically stops, and the micromachine switch 400 enters the ON state. Since the control method in the case of turning off the switch is the same as that described with reference to FIG. 4, a description thereof will be omitted.

As described above, according to the present embodiment, in the case of turning on the switch, the rotating body 102 can be mechanically stopped by the second signal electrode 405. This allows a switching operation to be performed at a desired position even if the rotation drive force continues to be applied to the rotating body 102. Further, since the rotating body 102 can be mechanically stopped by the second signal electrode 405, switching operations can be securely performed, and thus the micromachine switch with high electrical reliability can be realized.

Although the number of second signal electrodes 405 formed on the substrate 101 is 1, the present invention is not limited thereto. A plurality of second signal electrodes 405 may be formed on the substrate 101 as shown in FIG. 15. FIG. 15 is a top view of a micromachine switch 410. A structure of the micromachine switch 410 is different from the micromachine switch 400 only in that second signal electrodes 405a and 405b are formed instead of the second signal electrode 405. Therefore, components of the micromachine switch 410 other than these are denoted by the same reference numerals as those used for the micromachine switch 400, and descriptions of the components will be omitted. As shown in FIG. 15, the second signal electrodes 405a and 405b are provided at different positions from each other around the rotating body 102. The second signal electrode 405a comprises electrodes 4051a and 4052a. The electrode 4051a has the same shape as that of the second signal electrode 105, and is formed on the substrate 101 so as to be positioned near the hollow 101h. The electrode 4052a is plate-shaped as shown in FIGS. 13A and 14, and vertically provided on the electrode 4051a. The second signal electrode 405b comprises electrodes 4051b and 4052b. The electrode 4051b has the same shape as that of the second signal electrode 105, and is provided on the substrate 101 so as to be positioned near the hollow 101h. The electrode 4052b is plate-shaped as shown in FIGS. 13A and 14, and vertically provided on the electrode 4051b. The electrode 4032 of the movable electrode 403, and the electrodes 4052a and 4052b are positioned such that the electrode 4032 contacts or does not contact the electrode 4052a or 4052b in accordance with the rotation of the rotating body 102. Here, FIG. 15 shows an OFF state where the movable electrode 403 is not electrically connected to either the second signal electrode 405a or the second signal electrode 405b.

Next, switching operations of the micromachine switch 410 will be described. The micromachine switch 410 is either in the OFF state as shown in FIG. 15 or in a state where the movable electrode 403 is electrically connected to either one of the second signal electrodes 405a and 405b. In the micromachine switch 410, which one of the second signal electrodes 405a and 405b the movable electrode 403 is to be connected to is determined by controlling the rotation direction and rotation amount of the rotating body 102. In other words, the control section 202 may output a plurality of types of ON control signals respectively corresponding to the second signal electrodes 405a and 405b.

By using such a structure as shown in FIG. 15, a micromachine switch, which is able to respond to a plurality of inputs/outputs, can be provided while preventing the micromachine switch from becoming large sized.

Fourth Embodiment

With reference to FIGS. 16A to 17, a micromachine switch 500 according to a fourth embodiment of the present invention will be described. FIGS. 16A and 16B are top views of the micromachine switch 500 according to the fourth embodiment. FIG. 16A shows an OFF state, and FIG. 16B shows an ON state. FIG. 17 is a cross-sectional view of the micromachine switch 500 cut along a line AA shown in FIG. 16B.

First, a structure of the micromachine switch 500 will be described. As shown in FIGS. 16A to 17, the micromachine switch 500 comprises the substrate 101, the rotating body 102, a movable electrode 503, the first signal electrode 104, a second signal electrode 505, the spacer 106 and the rotation drive section 107. The micromachine switch 500 is different from the micromachine switch 100 described in the first embodiment in that: the movable electrode 103 is replaced with the movable electrode 503; the second signal electrode 105 is replaced with the second signal electrode 505; and these electrodes are electrically connected by capacitive coupling between the electrodes. Components of the micromachine switch 500 other than the movable electrode 503 and the second signal electrode 505 are the same as those of the micromachine switch 100, and denoted by the same reference numerals as those used for the micromachine switch 100. Therefore, descriptions of the components will be omitted.

The movable electrode 503 comprises electrodes 5031 and 5032. The electrode 5031 has the same shape as that of the above-described movable electrode 103, and is formed on the rotating body 102. The electrode 5032 is provided at an outer circumferential surface of the electrode 5031, so as to protrude around the rotating body 102. The second signal electrode 505 comprises electrodes 5051 and 5052. The electrode 5051 has the same shape as that of the second signal electrode 105, and is formed on the substrate 101 so as to be positioned near the hollow 101h. As shown in FIG. 16A, the electrode 5052 has an annular shape having a part thereof removed. The electrode 5052 is formed on the substrate 101 such that an outer circumferential portion of the electrode 5052 is connected to the electrode 5051 and a shape of an inner circumferential portion thereof follows a shape of the hollow 101h. As shown in FIG. 17, a gap is formed between the electrode 5032 of the movable electrode 503 and the electrode 5052 of the second signal electrode 505.

Next, with reference to FIGS. 16A and 16B, switching operations of the above-structured micromachine switch 500 will be described. The micromachine switch 500 causes the rotating body 102 to rotate, thereby performing switching operations by capacitive coupling. Hereinafter, a specific description of a case where the switch is turned on and a specific description of a case where the switch is turned off are given separately. It is assumed in the descriptions below that the OFF state shown in FIG. 16A is an initial state. In FIG. 16A, the movable electrode 503 is in the position of 9 o'clock.

In the case of turning on the switch by capacitive coupling between the movable electrode 503 and the second signal electrode 505, the rotating body 102 rotates clockwise (in a direction indicated by a dotted arrow shown in FIG. 16A) from a state where the movable electrode 503 is in the position of 9 o'clock. When the movable electrode 503 arrives at the position of 12 o'clock, the electrode 5032 of the movable electrode 503 overlaps the electrode 5052 of the second signal electrode 505 to the fullest extent with the gap there between, and then the rotating body 102 stops rotating. To be specific, voltages start to be applied to the respective pairs of first drive electrodes of the rotation drive section 107 in accordance with an ON control signal from outside, whereby the rotating body 102 rotates clockwise. Thereafter, when the movable electrode 503 arrives at the position of 12 o'clock, the application of the voltages to the respective pairs of first drive electrodes of the rotation drive section 107 is ceased in accordance with the ON control signal from outside. As a result, as shown in FIG. 16B, the movable electrode 503 and the second signal electrode 505 are electrically connected by capacitive coupling there between, and the micromachine switch 500 enters the ON state. In FIG. 16B, an area surrounded by dotted lines indicates an overlap portion S.

On the other hand, in the case of turning off the switch by disconnecting the electrical connection established by the capacitive coupling between the movable electrode 503 and the second signal electrode 505, the rotating body 102 rotates counterclockwise (in a direction indicated by a dotted arrow shown in FIG. 16B) from a state where the movable electrode 503 is in the position of 12 o'clock, and stops when the movable electrode 503 arrives at the position of 9 o'clock. To be specific, voltages start to be applied to the respective pairs of first drive electrodes of the rotation drive section 107 in accordance with an OFF control signal from outside, whereby a counterclockwise rotation drive force is generated at the rotation drive section 107. Thereafter, when the movable electrode 503 arrives at the position of 9 o'clock, the application of the voltages to the respective pairs of first drive electrodes of the rotation drive section 107 is ceased in accordance with the OFF control signal from outside. As a result, as shown in FIG. 16A, the overlap portion S disappears, and the electrical connection established by the capacitive coupling between the movable electrode 503 and the second signal electrode 505 is disconnected, and the micromachine switch 500 enters the OFF state.

Note that, since a method herein for controlling the rotation of the rotating body 102 is the same as that described in the first embodiment, a description thereof will be omitted.

As described above, according to the present embodiment, the movable electrode 503 and the second signal electrode 505 are electrically connected by capacitive coupling. As a result, the movable electrode 503 does not have any portion which mechanically contacts the second signal electrode 505. This prevents frictional wear of the electrodes, which is caused by such a mechanical contact, and also prevents deterioration in characteristics, which is caused by frictional wear of the electrodes. Therefore, this is particularly useful for practical use.

Although the above description describes only the switching operations using the capacitive coupling, an operation in which the movable electrode 503 and the second signal electrode 505 mechanically contact each other may be additionally performed as shown in FIGS. 18A to 19. FIGS. 18A and 18B are top views of a micromachine switch 510 which further performs an additional operation to cause the movable electrode 503 and the second signal electrode 505 to mechanically contact each other. FIG. 18A shows an OFF state, and FIG. 18B shows an ON state. FIG. 19 is a cross-sectional view of the micromachine switch 510 cut along a line AA shown in FIG. 18B.

First, a structure of the micromachine switch 510 will be described. As shown in FIGS. 18A to 19, the micromachine switch 510 comprises the substrate 101, the rotating body 102, a movable electrode 503a, the first signal electrode 104, a second signal electrode 505a, the spacer 106 and the rotation drive section 107. Note that the micromachine switch 510 is different from the above-described micromachine switch 500 in that: the movable electrode 503 is replaced with the movable electrode 503a; the second signal electrode 505 is replaced with the second signal electrode 505a; and an operation for causing the movable electrode 503 and the second signal electrode 505 to mechanically contact each other, is additionally performed. Components of the micromachine switch 510 other than the movable electrode 503a and the second signal electrode 505a are the same as those of the micromachine switch 500, and denoted by the same reference numerals as those used for the micromachine switch 500. Therefore, descriptions of the components will be omitted.

The movable electrode 503a comprises the electrodes 5031 and 5032, displacement electrodes 5033 and 5036, and insulators 5034 and 5035. Since the electrodes 5031 and 5032 are the same as those of the micromachine switch 500, descriptions thereof will be omitted. The displacement electrode 5033 is provided laterally to the electrode 5032 via the insulator 5034. The displacement electrode 5036 is provided laterally to the electrode 5032 via the insulator 5035 so as to be positioned at an opposite side to the displacement electrode 5033. Note that, the displacement electrodes 5033 and 5036 are provided on the same plane as that of the electrodes 5031 and 5032.

The second signal electrode 505a comprises the electrodes 5051 and 5052 and fixed electrodes 5053 and 5054. Since the electrodes 5051 and 5052 are the same as those of the micromachine switch 500, descriptions thereof will be omitted. The fixed electrode 5053 is provided on the substrate 101 so as to be positioned laterally to the electrode 5052. The fixed electrode 5054 is provided on the substrate 101 so as to be positioned laterally to the electrode 5052, and so as to be positioned at an opposite side to the fixed electrode 5053. The fixed electrodes 5053 and 5054 are provided so as to respectively face the displacement electrodes 5036 and 5033 in the ON state shown in FIG. 18B.

Next, with reference to FIGS. 18A and 18B, switching operations of the above-structured micromachine switch 510 will be described. The micromachine switch 510 causes the rotating body 102 to rotate, thereby performing a switching operation by capacitive coupling and an operation for causing the movable electrode 503a and the second signal electrode 505a to mechanically contact each other. Hereinafter, a specific description of a case where the switch is turned on and a specific description of a case where the switch is turned off are given separately. It is assumed in the descriptions below that the OFF state shown in FIG. 18A is an initial state. In FIG. 18A, the movable electrode 503a is in the position of 9 o'clock.

In the case of turning on the switch by capacitive coupling between the movable electrode 503a and the second signal electrode 505a, the rotating body 102 rotates clockwise (in a direction indicated by a dotted arrow shown in FIG. 18A) from a state where the movable electrode 503a is in the position of 9 o'clock. When the movable electrode 503a arrives at the position of 12 o'clock, the electrode 5032 of the movable electrode 503a entirely overlaps the electrode 5052 of the second signal electrode 505a with a gap there between, and the rotating body 102 stops rotating. To be specific, voltages start to be applied to the respective pairs of first drive electrodes of the rotation drive section 107 in accordance with an ON control signal from outside, whereby the rotating body 102 rotates clockwise. Thereafter, when the movable electrode 503a arrives at the position of 12 o'clock, the application of the voltages to the respective pairs of first drive electrodes of the rotation drive section 107 is ceased in accordance with the ON control signal from outside. As a result, as shown in FIG. 18B, the movable electrode 503a is electrically connected to the second signal electrode 505a by capacitive coupling, and the micromachine switch 510 enters the ON state.

Thereafter, in accordance with an ON control signal from outside, voltages are applied between the displacement electrode 5036 and the fixed electrode 5053, and between the displacement electrode 5033 and the fixed electrode 5054, respectively. As a result, the displacement electrode 5036 is displaced and then mechanically contacts the fixed electrode 5053. In a similar manner, the displacement electrode 5033 is displaced, and then mechanically contacts the fixed electrode 5054. Consequently, as shown in FIG. 19, the electrode 5032 of the movable electrode 503a is displaced, and then mechanically contacts the electrode 5052 of the second signal electrode 505a.

On the other hand, in the case of turning off the switch by disconnecting the electrical connection between the movable electrode 503a and the second signal electrode 505a, first, the application of the voltage between the displacement electrode 5036 and the fixed electrode 5053 and the application of the voltage between the displacement electrode 5033 and the fixed electrode 5054, are ceased in accordance with an OFF control signal from outside. As a result, the electrode 5032 of the movable electrode 503a returns to its original state where the electrode 5032 is electrically connected to the electrode 5052 of the second signal electrode 505a by capacitive coupling.

Subsequently, voltages start to be applied to the respective pairs of first drive electrodes of the rotation drive section 107 in accordance with an OFF control signal from outside, whereby a counterclockwise rotation drive force is generated at the rotation drive section 107. Thereafter, when the movable electrode 503a arrives at the position of 9 o'clock, the application of the voltages to the respective pairs of first drive electrodes of the rotation drive section 107 is ceased in accordance with the OFF control signal from outside. In this manner, the rotating body 102 rotates counterclockwise (in a direction indicated by a dotted arrow shown in FIG. 18B) from a state where the movable electrode 503a is in the position of 12 o'clock, and stops when the movable electrode 503a arrives at the position of 9 o'clock. Consequently, as shown in FIG. 18A, the electrical connection established by capacitive coupling between the movable electrode 503a and the second signal electrode 505a is disconnected, and the micromachine switch 510 enters the OFF state.

Note that, a method herein for controlling the rotation of the rotating body 102 is almost identical with the control method described in the first embodiment. In this case, however, the drive circuit 200 shown in FIG. 4 further comprises a voltage applying section (not shown) for applying the voltages between the displacement electrode 5036 and the fixed electrode 5053, and between the displacement electrode 5033 and the fixed electrode 5054, respectively. Here, the control section 202 may output, to the voltage applying section, an ON control signal which indicates a timing at which to apply the voltages between the displacement electrode 5036 and the fixed electrode 5053, and between the displacement electrode 5033 and the fixed electrode 5054, respectively.

As described above, by additionally performing the operation for causing the movable electrode 503a and the second signal electrode 505a to mechanically contact each other, the micromachine switch 510 can be caused to enter, after capacitive coupling is softly performed, the ON state by mechanical contact. Further, as compared to the case where the movable electrode 503a and the second signal electrode 505a mechanically contact each other during the rotation, stress imposed on each electrode can be reduced. If there is no necessity to take such stress into consideration, the gap may not necessarily be formed between the electrode 5032 of the movable electrode 503 and the electrode 5052 of the second signal electrode 505 in FIG. 17.

Fifth Embodiment

With reference to FIGS. 20A to 21, a micromachine switch 600 according to a fifth embodiment of the present invention will be described. FIGS. 20A and 20B are top views of the micromachine switch 600 according to the fifth embodiment. FIG. 20A shows an OFF state, and FIG. 20B shows an ON state. FIG. 21 is a functional block diagram which represents functions of the micromachine switch 600 and a drive circuit 200b for controlling the rotation of the rotating body 102.

First, a structure of the micromachine switch 600 will be described. As shown in FIGS. 20A to 21, the micromachine switch 600 comprises the substrate 101, the rotating body 102, the movable electrode 503, the first signal electrode 104, the second signal electrode 505, a position detection section 601, the spacer 106 and the rotation drive section 107. Note that, the micromachine switch 600 is different from the micromachine switch 500 described in the fourth embodiment in that a position of the first signal electrode 104 on the substrate 101 is different, and that the position detection section 601 is additionally provided. Components of the micromachine switch 600 other than the position detection section 601 are the same as those of the micromachine switch 500, and denoted by the same reference numerals as those used for the micromachine switch 500. Therefore, descriptions of the components will be omitted.

Looking at FIG. 20A, the first signal electrode 104 is provided on the right side of the substrate 101. The position detection section 601 comprises a position-detecting movable electrode 602 and a position-detecting fixed electrode 603. The position-detecting movable electrode 602 is provided on the rotating body 102 so as to be in such a position as to be symmetrical to the movable electrode 503 with respect to the rotation axis of the rotating body 102. Also, the position-detecting movable electrode 602 is provided so as to protrude around the rotating body 102. The position-detecting fixed electrode 603 comprises electrodes 6031 and 6032. The electrodes 6031 and 6032 are provided on the substrate 101 so as to be in such positions as to be symmetrical to the second signal electrode 505 with respect to the rotation axis of the rotating body 102. Here, in the ON state shown in FIG. 20B, a gap is formed between the position-detecting movable electrode 602 and the position-detecting fixed electrode 603.

Next, with reference to FIGS. 20A and 20B, switching operations of the above-structured micromachine switch 600 will be described. By causing the rotating body 102 to rotate, the micromachine switch 600 performs switching operations by capacitive coupling. Hereinafter, a specific description of a case where the switch is turned on and a specific description of a case where the switch is turned off are given separately. It is assumed in the descriptions below that the OFF state shown in FIG. 20A is an initial state. In FIG. 20A, the movable electrode 503 is in the position of 9 o'clock.

In the case of turning on the switch by capacitive coupling between the movable electrode 503 and the second signal electrode 505, the rotating body 102 rotates clockwise (in a direction indicated by a dotted arrow shown in FIG. 20A) from a state where the movable electrode 503 is in the position of 9 o'clock. When the movable electrode 503 arrives at the position of 12 o'clock, the electrode 5032 of the movable electrode 503 overlaps the electrode 5052 of the second signal electrode 505 to the fullest extent with a gap there between, and the rotating body 102 stops rotating. To be specific, voltages start to be applied to the respective pairs of first drive electrodes of the rotation drive section 107 in accordance with an ON control signal from outside, whereby the rotating body 102 rotates clockwise. Thereafter, when the movable electrode 503 arrives at the position of 12 o'clock, the application of the voltages to the respective pairs of first drive electrodes of the rotation drive section 107 is ceased in accordance with the ON control signal from outside. As a result, as shown in FIG. 20B, the movable electrode 503 is electrically connected to the second signal electrode 505 by capacitive coupling, and the micromachine switch 600 enters the ON state. S1 shown in FIG. 20B indicates an area where the movable electrode 503 overlaps the second signal electrode 505.

Here, when the rotating body 102 rotates clockwise from the state where the movable electrode 503 is in the position of 9 o'clock, the position-detecting movable electrode 602 also rotates clockwise. As a result, in the ON state shown in FIG. 20B, the position-detecting movable electrode 602 overlaps the position-detecting fixed electrode 603. Consequently, capacitive coupling occurs between the position-detecting movable electrode 602 and the position-detecting fixed electrode 603. Here, capacitance between these electrodes changes depending on a size of a portion S2 in which the electrodes overlap. Then, by detecting a change in the capacitance, a position of the rotating body 102 (i.e., a position of the movable electrode 503) can be detected.

On the other hand, in the case of turning off the switch by disconnecting the electrical connection established by capacitive coupling between the movable electrode 503 and the second signal electrode 505, the rotating body 102 rotates counterclockwise (in a direction indicated by a dotted arrow shown in FIG. 20B) from a state where the movable electrode 503 is in the position of 12 o'clock, and stops when the movable electrode 503 arrives at the position of 9 o'clock. To be specific, voltages start to be applied to the respective pairs of first drive electrodes of the rotation drive section 107 in accordance with an OFF control signal from outside, whereby a counterclockwise rotation drive force is generated at the rotation drive section 107. Thereafter, when the movable electrode 503 arrives at the position of 9 o'clock, the application of the voltages to the respective pairs of first drive electrodes of the rotation drive section 107 is ceased in accordance with the OFF control signal from outside. As a result, as shown in FIG. 20A, the overlap portion S1 disappears, and the electrical connection by the capacitive coupling between the movable electrode 503 and the second signal electrode 505 is disconnected, and the micromachine switch 600 enters the OFF state.

Next, with reference to FIG. 21, a method for controlling the rotation of the rotating body 102 will be described in detail. As shown in FIG. 21, the micromachine switch 600 comprises the rotation drive section 107, a switch circuit 604 and the position detection section 601. The switch circuit 604 comprises the rotating body 102, the movable electrode 503, the first signal electrode 104 and the second signal electrode 505. An outlined arrow shown in FIG. 21 represents a rotation drive force with which the rotation drive section 107 causes the rotating body 102 of the switch circuit 604 to rotate. The drive circuit 200b comprises the voltage applying section 201 and a control section 202b. Note that, the drive circuit 200b is, similarly to the drive circuit 200, an individual unit formed by integration of semiconductor devices. Based on an ON control signal or OFF control signal provided from the control section 202b, the voltage applying section 201 applies, to the respective pairs of first drive electrodes of the rotation drive section 107, voltages which are different in phase from each other.

The control section 202b controls the rotation direction and the rotation amount of the rotating body 102. Operations of the control section 202b are different from those of the control section 202 shown in FIG. 4 in that the control section 202b performs the control by using a change in capacitance detected by the position detection section 601. For this reason, only this difference is described below. The control section 202b detects, based on a change in the capacitance detected by the position detection section 601, a position of the rotating body 102. Then, when a predicted position of the rotating body 102 is different from an actual detected position of the rotating body 102, the control section 202b corrects, based on the actual detected position of the rotating body 102, the phase information, the application time and the like of control signals, which are preset in the control section 202b. This realizes highly precise control.

As described above, according to the present embodiment, highly precise switching operations can be realized by detecting the position of the rotating body 102.

Note that, in the above description, the number of second signal electrodes 505 formed on the substrate 101 is 1. However, the present invention is not limited thereto. A plurality of second signal electrodes 505 may be formed on the substrate 101 as shown in FIG. 22. FIG. 22 is a top view of a micromachine switch 610. A structure of the micromachine switch 610 is different from the micromachine switch 600 in that second signal electrodes 505a to 505c are formed instead of the second signal electrode 505, and that position-detecting fixed electrodes 603a to 603c are formed instead of the position-detecting fixed electrode 603. Therefore, components of the micromachine switch 610 other than these are denoted by the same reference numerals as those used for the micromachine switch 600, and descriptions of the components will be omitted.

As shown in FIG. 22, the second signal electrodes 505a to 505c are respectively provided at different positions from each other around the rotating body 102. The second signal electrodes 505a to 505c are equivalent to a plurality of inputs (or outputs). The position-detecting fixed electrode 603a comprises electrodes 6031a and 6032a. The electrodes 6031a and 6032a are provided on the substrate 101 so as to be in such positions as to be symmetrical to the second signal electrode 505c with respect to the rotation axis of the rotating body 102. The position-detecting fixed electrode 603b comprises electrodes 6031b and 6032b. The electrodes 6031b and 6032b are provided on the substrate 101 so as to be in such positions as to be symmetrical to the second signal electrode 505b with respect to the rotation axis of the rotating body 102. The position-detecting fixed electrode 603c comprises electrodes 6031c and 6032c. The electrodes 6031c and 6032c are provided on the substrate 101 so as to be in such positions as to be symmetrical to the second signal electrode 505a with respect to the rotation axis of the rotating body 102. It is assumed here that: the electrodes 6031a and 6032a are the same in size; the electrodes 6031b and 6032b are the same in size; and the electrodes 6031c and 6032c are the same in size.

Having such a structure as shown in FIG. 22 enables detection of respective positions of the movable electrode 503 when connected to the second signal electrodes 505a to 505c. In this case, changes in capacitances detected by the position detection section 601 are as shown in FIG. 23. FIG. 23 shows changes in capacitances detected by the position detection section 601 in the case where the micromachine switch 610 is structured as shown in FIG. 22. The rotation amount indicated along the horizontal axis in FIG. 23 is 0 when the micromachine switch 610 is in such a state as shown in FIG. 22. The clockwise rotation direction is a positive rotation direction of the rotating body 102. In FIG. 23, points at which detected capacitances become maximum indicate that the position-detecting movable electrode 602 overlaps, to the fullest extent, the position-detecting fixed electrodes 603a to 603c, respectively. Which one of the position-detecting fixed electrodes 603a to 603c the position-detecting movable electrode 602 is positioned on, can be determined by referring to this maximum point of a detected capacitance. Accordingly, based on the changes in the capacitances shown in FIG. 23, the control section 202b can detect positions of the rotating body 102, which respectively correspond to a plurality of inputs. Then, the control section 202b can correct, based on an actual detected position of the rotating body 102, the phase information, the application time and the like of control signals, which are preset in the control section 202b. This realizes highly precise control.

In FIG. 22, the electrodes 6031a and 6032a are the same in size; the electrodes 6031b and 6032b are the same in size; and the electrodes 6031c and 6032c are the same in size. However, the present invention is not limited thereto. As another example, as shown in FIG. 24, the micromachine switch 610 may be structured such that: the electrode 6031a is smaller in size than the electrode 6032a; the electrode 6031b is smaller in size than the electrode 6032b; and the electrode 6031c is smaller in size than the electrode 6032c.

In the case where the micromachine switch 610 is structured as shown in FIG. 24, changes in capacitances detected by the position detection section 601 are as shown in FIG. 25. FIG. 25 shows changes in capacitances detected by the position detection section 601 in the case where the micromachine switch 610 is structured as shown in FIG. 24. The rotation amount indicated along the horizontal axis in FIG. 25 is 0 when the micromachine switch 610 is in such a state as shown in FIG. 24. The clockwise rotation direction is a positive rotation direction of the rotating body 102. As shown in FIG. 25, a degree of change in each detected capacitance differs between before and after a point at which said each detected capacitance becomes maximum. This is because: the electrode 6031a is smaller in size than the electrode 6032a; the electrode 6031b is smaller in size than the electrode 6032b; and the electrode 6031c is smaller in size than the electrode 6032c. In other words, the rotation direction of the rotating body 102 can be detected based on a degree of change in capacitance. To be specific, for example, the electrode 6031a is smaller in size than the electrode 6032a. When the position-detecting movable electrode 602 covers the electrodes 6031a and 6032a to the fullest extent, a capacitance value for the position-detecting movable electrode 602 and the electrodes 6031a and 6032a becomes maximum. If changes in the capacitance value are compared based on a rotation direction of the position-detecting movable electrode 602, a degree of change in the capacitance value is greater when the position-detecting movable electrode 602 rotates toward the electrode 6031a from a position where the capacitance value becomes maximum than when the position-detecting movable electrode 602 rotates toward the electrode 6032a from the position where the capacitance value becomes maximum, that is, the degree of change in the capacitance value is lesser when the position-detecting movable electrode 602 rotates toward the electrode 6032a from the position where the capacitance value becomes maximum than when the position-detecting movable electrode 602 rotates toward the electrode 6031a from the position where the capacitance value becomes maximum. By detecting this difference, the control section 202b can recognize the rotation direction. This allows the control to be performed with greater precision.

Sixth Embodiment

With reference to FIG. 26, a filter circuit 700, which uses the micromachine switch as described in the first to fifth embodiments, will be described. FIG. 26 shows a circuit structure of the filter circuit 700.

First, the structure of the filter circuit 700 will be described with reference to FIG. 26. The filter circuit 700 comprises a micromachine switch 701, piezoelectric thin-film resonator filters 702 and 703, and terminals 704 to 708.

The micromachine switch 701 has the same structure as and performs the same switching operations as those of any of the micromachine switches described in the first to fifth embodiments. Here, the micromachine switch 701 has two outputs, i.e., a first signal electrode 7014 and second signal electrodes 7015a and 7015b. The first signal electrode 7014 is connected to the terminal 704. The second signal electrode 7015a is connected to the terminal 705. The second signal electrode 7015b is connected to the terminal 706.

The piezoelectric thin-film resonator filter 702 has a predetermined frequency band, and is provided between the terminals 705 and 707. The piezoelectric thin-film resonator filter 702 comprises piezoelectric thin-film resonators 7021a to 7021c and piezoelectric thin-film resonators 7022a and 7022b. The piezoelectric thin-film resonators 7021a to 7021c are serially connected between the terminals 705 and 707. One end of the piezoelectric thin-film resonator 7022a is connected between the piezoelectric thin-film resonators 7021a and 7021b, and the other end thereof is grounded. One end of the piezoelectric thin-film resonator 7022b is connected between the piezoelectric thin-film resonators 7021b and 7021c, and the other end is grounded.

The piezoelectric thin-film resonator filter 703 has a different frequency band from that of the piezoelectric thin-film resonator filter 702, and is provided between the terminals 706 and 708. The piezoelectric thin-film resonator filter 703 comprises piezoelectric thin-film resonators 7031a to 7031c and piezoelectric thin-film resonators 7032a and 7032b. The piezoelectric thin-film resonators 7031a to 7031c are serially connected between the terminals 706 and 708. One end of the piezoelectric thin-film resonator 7032a is connected between the piezoelectric thin-film resonators 7031a and 7031b, and the other end is grounded. One end of the piezoelectric thin-film resonator 7032b is connected between the piezoelectric thin-film resonators 7031b and 7031c, and the other end is grounded.

Next, operations of the above-structured filter circuit 700 will be described. By a switching operation performed by the micromachine switch 701, the terminal 704 is connected to the terminal 705 or to the terminal 706. When the terminal 704 and the terminal 705 are connected, a signal inputted to the terminal 704 passes through the terminal 705 and is inputted to the piezoelectric thin-film resonator filter 702. When the terminals 704 and 706 are connected, a signal inputted to the terminal 704 passes through the terminal 706, and is inputted to the piezoelectric thin-film resonator filter 703.

By performing the switching operation of the micromachine switch 701 as described above, the frequency band can be switched freely. As a result, a filter circuit for switching a frequency band, which accommodates a plurality of frequency bands, can be realized.

Note that, although the filter circuit 700 in FIG. 26 comprises the piezoelectric thin-film resonator filters 702 and 703, the filter circuit may be formed as a filter circuit 720 which further comprises, as shown in FIG. 27, a piezoelectric thin-film resonator filter 709. FIG. 27 shows a circuit structure of the filter circuit 720. A micromachine switch 701a shown in FIG. 27 has the same structure as and performs the same switching operations as any of the micromachine switches described in the first to fifth embodiments. Here, the micromachine switch 701a has three outputs, i.e., the first signal electrode 7014 and second signal electrodes 7015a to 7015c. Also, as compared to the filter circuit 700, the filter circuit 720 further comprises terminals 710 and 711. The piezoelectric thin-film resonator filter 709 has a different frequency band from that of the piezoelectric thin-film resonator filters 702 and 703, and is provided between the terminals 710 and 711. The piezoelectric thin-film resonator filter 709 comprises piezoelectric thin-film resonators 7091a to 7091c and piezoelectric thin-film resonators 7092a and 7092b. The piezoelectric thin-film resonators 7091a to 7091c are serially connected between the terminals 710 and 711. One end of the piezoelectric thin-film resonator 7092a is connected between the piezoelectric thin-film resonators 7091a and 7091b, and the other end thereof is grounded. One end of the piezoelectric thin-film resonator 7092b is connected between the piezoelectric thin-film resonators 7091b and 7091c, and the other end thereof is grounded.

Seventh Embodiment

With reference to FIG. 28, a duplexer circuit 800, which uses the micromachine switch as described in the first to fifth embodiments, will be described. FIG. 28 shows a circuit structure of the duplexer circuit 800.

First, the structure of the duplexer circuit 800 will be described with reference to FIG. 28. The duplexer circuit 800 comprises a micromachine switch 801, transmission filters 802a and 802b, reception filters 803a and 803b, phase circuits 804a and 804b, and terminals 805 to 813.

The micromachine switch 801 has the same structure as and performs the same switching operations as those of any of the micromachine switches described in the first to fifth embodiments. Here, the micromachine switch 801 has two outputs, i.e., a first signal electrode 8014 and second signal electrodes 8015a and 8015b. The first signal electrode 8014 is connected to the terminal 805. The second signal electrode 8015a is connected to the terminal 806 and the phase circuit 804a. The second signal electrode 8015b is connected to the terminal 808 and the phase circuit 804b.

The transmission filter 802a has a predetermined frequency band, and is provided between the terminals 806 and 810. The reception filter 803a has a different frequency band from that of the transmission filter 802a, and is provided between the terminals 807 and 811. Thus, the combination of the transmission filter 802a, the reception filter 803a and the phase circuit 804a acts as a single duplexer.

The transmission filter 802b has a predetermined frequency band, and is provided between the terminals 808 and 812. The reception filter 803b has a different frequency band from that of the transmission filter 802b, and is provided between the terminals 809 and 813. Thus, the combination of the transmission filter 802b, the reception filter 803b and the phase circuit 804b acts as a single duplexer. Note that, this duplexer has a different frequency band from that of the duplexer comprising the transmission filter 802a, the reception filter 803a and the phase circuit 804a. Further, the above-described transmission filters 802a and 802b and the reception filters 803a and 803b have the same structure as that of the piezoelectric thin-film resonator filter 702 of FIG. 26, and have different frequency bands from each other.

Next, operations of the above-structured duplexer circuit 800 will be described. A switching operation of the micromachine switch 801 causes the terminal 805 to be connected to the duplexer which comprises the transmission filter 802a, the reception filter 803a and the phase circuit 804a, or to the duplexer which comprises the transmission filter 802b, the reception filter 803b and the phase circuit 804b.

As described above, according to the duplexer circuit 800, the switching operation of the micromachine switch 801 can switch a plurality of duplexers there between, the plurality of duplexers having different frequency bands from each other.

Further, since a necessity to arrange a plurality of switches is eliminated by using the micromachine switch as described in the first to fifth embodiments, the duplexer circuit 800 can be miniaturized. Still further, since there is no necessity to arrange a plurality of switches, the duplexer circuit 800, whose loss is less than the one in which a plurality of arranged switches are mounted, can be realized. The reason for this is described below.

Frequencies of signals used in a wireless communication device or the like range from a few MHz to a few GHz. For this reason, stray capacitance, wiring extension and the like cause an increase in loss. However, by using the micromachine switch 801 as described in the present embodiment, which is able to switch a plurality of outputs there between, it is no longer necessary to arrange a plurality of switches and to extend wiring between the plurality of switches. This enables reduction of losses caused by wiring and stray capacitance.

The present embodiment describes the example in which the duplexer circuit 800 comprises the micromachine switch 801, the transmission filters 802a and 802b, the reception filters 803a and 803b, and the phase circuits 804a and 804b. However, the present embodiment is not limited thereto. It is understood that the same effect as that described in the description of the duplexer circuit 800 can be obtained even by a structure which only includes the micromachine switch and the multiple transmission filters, or by a structure which only includes the micromachine switch and the multiple reception filters.

Further, the present embodiment describes the example of the duplexer circuit 800 which is a frequency band variable duplexer circuit in which the filters having different frequency bands are combined. However, the present embodiment is not limited thereto. For example, filters, which have different impedances from each other, can be combined to realize an impedance variable duplexer circuit.

Eighth Embodiment

With reference to FIG. 29, a communication apparatus 900 will be described. FIG. 29 shows a circuit structure of the communication apparatus 900.

The communication apparatus 900 comprises antennas 901a and 901b, a duplexer circuit 902, amplifiers (PA) 903a and 903b, low-noise amplifiers (LNA) 904a and 904b, a baseband section 905, terminals 906a and 906b, and terminals 907a and 907b.

The duplexer circuit 902 is different in structure from the duplexer circuit 800 according to the seventh embodiment in that the micromachine switch 801 has a structure as shown in FIGS. 6A and 6B. Further, the micromachine switch 801 of the duplexer circuit 902 is structured so as to perform switching between two outputs and switching between two inputs. Also, second signal electrodes corresponding to two outputs are the second signal electrodes 8015a and 8015b, and second signal electrodes corresponding to two inputs are second signal electrodes 8015c and 8015d. Further, terminals of the duplexer circuit 902, which correspond to the second signal electrodes 8015c and 8015d, are terminals 805a and 805b.

Antennas 901a and 901b are respectively connected to the terminals 805a and 805b of the duplexer circuit 902. The terminal 810 of the duplexer circuit 902 is connected to the amplifier 903a; the terminal 811 thereof is connected to the low-noise amplifier 904a; the terminal 812 thereof is connected to the amplifier 903b; and the terminal 813 thereof is connected to the low-noise amplifier 904b. In accordance with switching operations performed by the micromachine switch 801 in the duplexer circuit 902, radio signals, which are inputted to or outputted from the antennas 901a and 901b, pass through duplexers having different frequency bands from each other. A transmission signal inputted to the terminal 906a is outputted to the antenna 901a via the baseband section 905, the amplifier 903a and the duplexer circuit 902. A transmission signal inputted to the terminal 906b is outputted to the antenna 901b via the baseband section 905, the amplifier 903 band the duplexer circuit 902. A reception signal from the antenna 901a is outputted to the terminal 907a via the duplexer circuit 902, the low-noise amplifier 904a and the baseband section 905. A reception signal from the antenna 901b is outputted to the terminal 907b via the duplexer circuit 902, the low-noise amplifier 904b and the baseband section 905.

As described above, a communication device, which realizes miniaturization and low loss thereof, can be provided by adopting, in the communication device, the duplexer circuit 902 in which the micromachine switch as described in the first to fifth embodiments is used.

Note that, the above-described micromachine switches, filter circuits, duplexer circuits and communication device of the present invention are highly useful for a high-frequency circuit of a mobile communication terminal such as a mobile phone, wireless LAN device or the like.

While the present invention has been described in detail, the foregoing description is in all aspects illustrative and not restrictive. It is understood that numerous other modifications and variations can be devised without departing from the scope of the present invention.

INDUSTRIAL APPLICABILITY

The micromachine switch according to the present invention is capable of securing both high isolation and mechanical reliability, and also capable of responding to a plurality of inputs/outputs, while the micromachine switch is prevented from becoming large sized and a cost increase of the micromachine switch is suppressed. Therefore, the micromachine switch is useful as, e.g., a switch of a high-frequency circuit which is required, e.g., to have efficiency in signal transmission, to have insulation at disconnection, or to perform high-speed switching operations. Also, the micromachine switch according to the present invention is useful as, e.g., a switch for switching a plurality of filters there between or for switching a plurality of communication systems there between.

The invention claimed is:

1. A micromachine switch for switching an electrical connection between signal electrodes in accordance with control signals from outside which include: a first control signal for electrically connecting the signal electrodes between which a signal is to be passed; and a second control signal for disconnecting the electrical connection between the signal electrodes, the micromachine switch comprising:
   a substrate;
   a rotating body provided on the substrate, which is rotatable on the substrate;
   a movable electrode provided on the rotating body;
   a first signal electrode, one end of which is electrically connected to one end of the movable electrode, and another end of which is provided on the substrate;
   a second signal electrode which is provided near the rotating body so as to be positioned such that a rotation of the rotating body causes the second signal electrode to be electrically connected to another end of the movable electrode; and
   a drive section for causing, in accordance with the first control signal, the rotating body to rotate until the rotating body is in such a position as to allow the another end of the movable electrode and the second signal electrode to be electrically connected, and for causing, in accordance with the second control signal, the rotating body to rotate until the rotating body is in such a position as to disconnect an electrical connection between the another end of the movable electrode and the second signal electrode,
   wherein the another end of the movable electrode is provided so as to protrude around the rotating body from an outer circumference of the rotating body and so as to be caused by the rotation of the rotating body to overlap an upper surface of the second signal electrode with a gap between the another end of the movable electrode and the upper surface of the second signal electrode.

2. The micromachine switch according to claim 1, further comprising a plurality of the second signal electrodes provided at positions that are different from each other,
   wherein the drive section causes, in accordance with the first control signal, the rotating body to rotate until the rotating body is in such a position as to allow the another end of the movable electrode to be electrically connected to any one of the second signal electrodes.

3. The micromachine switch according to claim 1, further comprising a stopper which is movable upward and downward and which is provided so as to be positioned lower than a lower surface of the rotating body, wherein
   the rotating body has an incised portion which is formed in accordance with a position and a shape of the stopper, and
   the drive section causes, in accordance with the first control signal, the rotating body to rotate, and causes the stopper to move so as to be positioned higher than the lower surface of the rotating body.

4. The micromachine switch according to claim 1, further comprising:
   at least one displacement electrode which is provided on the rotating body so as to protrude around the rotating body from the outer circumference of the rotating body;
   an insulator for connecting the at least one displacement electrode and the movable electrode; and
   a fixed electrode which is provided on the substrate such that when the rotation of the rotating body causes the another end of the movable electrode to be positioned above the second signal electrode, the fixed electrode faces the at least one displacement electrode, wherein
   the drive section causes, in accordance with the first control signal, the rotating body to rotate until the another end of the movable electrode is positioned above the second signal electrode, and
   when the another end of the movable electrode is positioned above the second signal electrode, the at least one displacement electrode is displaced in accordance with the first control signal so as to be in such a position as to contact the fixed electrode.

5. The micromachine switch according to claim 1, further comprising:
   two first electrodes which are provided around the rotating body so as to be at positions that are symmetrical to the second signal electrode with respect to a rotation axis of the rotating body; and
   a second electrode which is provided on the rotating body so as to be at a position that is symmetrical to the movable electrode with respect to the rotation axis of the rotating body, wherein
   the second electrode is provided so as to protrude around the rotating body from the outer circumference of the rotating body and so as to be caused by the rotation of the rotating body to overlap an upper surface of each of the first electrodes with a gap between the second electrode and the upper surface of each of the first electrodes.

6. The micromachine switch according to claim 5, wherein sizes of the first electrodes are different from each other.

7. A micromachine switch for switching an electrical connection between signal electrodes in accordance with control signals from outside which include: a first control signal for electrically connecting the signal electrodes between which a signal is to be passed; and a second control signal for disconnecting the electrical connection between the signal electrodes, the micromachine switch comprising:
   a substrate;
   a rotating body provided on the substrate, which is rotatable on the substrate;
   a movable electrode provided on the rotating body;
   a first signal electrode, one end of which is electrically connected to one end of the movable electrode, and another end of which is provided on the substrate;

a second signal electrode which is provided near the rotating body so as to be positioned such that a rotation of the rotating body causes the second signal electrode to be electrically connected to another end of the movable electrode; and a drive section for causing, in accordance with the first control signal, the rotating body to rotate until the rotating body is in such a position as to allow the another end of the movable electrode and the second signal electrode to be electrically connected, and for causing, in accordance with the second control signal, the rotating body to rotate until the rotating body is in such a position as to disconnect an electrical connection between the another end of the movable electrode and the second signal electrode, wherein the drive section includes:

a plurality of pairs of first drive electrodes provided around the rotating body, in each of the pairs, the first drive electrodes are formed to have shapes that are symmetrical to each other with respect to a rotation axis of the rotating body; and a gear-like shaped second drive electrode which is provided at a lower surface of the rotating body so as to be on a same plane as that of each of the pairs of first drive electrodes, rotation of the gear-like shaped second drive electrode is caused by an application, in accordance with the first or the second control signal, of a voltage to each of the pairs of first drive electrodes, and the drive section causes, by the rotation of the gear-like shaped second drive electrode, the rotating body to rotate.

8. A micromachine switch for switching an electrical connection between signal electrodes in accordance with control signals from outside which include: a first control signal for electrically connecting the signal electrodes between which a signal is to be passed; and a second control signal for disconnecting the electrical connection between the signal electrodes, the micromachine switch comprising:

a substrate;

a rotating body provided on the substrate, which is rotatable on the substrate;

a movable electrode provided on the rotating body;

a first signal electrode, one end of which is electrically connected to one end of the movable electrode, and another end of which is provided on the substrate;

a second signal electrode which is provided near the rotating body so as to be positioned such that a rotation of the rotating body causes the second signal electrode to be electrically connected to another end of the movable electrode; and a drive section for causing, in accordance with the first control signal, the rotating body to rotate until the rotating body is in such a position as to allow the another end of the movable electrode and the second signal electrode to be electrically connected, and for causing, in accordance with the second control signal, the rotating body to rotate until the rotating body is in such a position as to disconnect an electrical connection between the another end of the movable electrode and the second signal electrode, wherein the drive section includes:

an elastic body provided below a lower surface of the rotating body; and a piezoelectric body provided at a lower surface of the elastic body, the piezoelectric body causes, by an application of a voltage corresponding to the first or the second control signal, an elastic traveling wave to be excited on a surface of the elastic body, the surface of the elastic body facing the lower surface of the rotating body, and by causing the elastic traveling wave to be excited, the drive section causes the rotating body to rotate.

9. The micromachine switch according to claim 8, wherein a lower surface of the piezoelectric body has a plurality of electrodes each having a width of ½ of a wavelength of the elastic traveling wave; an electrode having a width of ¾ of the wavelength of the elastic traveling wave; and an electrode having a width of ¼ of the wavelength of the elastic traveling wave, and the voltage corresponding to the first or the second control signal is applied to each of the plurality of electrodes each having the width of ½ of the wavelength of the elastic traveling wave, such that phases of voltages applied to adjacent electrodes among the plurality of electrodes each having the width of ½ of the wavelength of the elastic traveling wave are different by 90 degrees.

10. A filter circuit for switching between a plurality of filters, the filters having frequency bands that are different from each other, the filter circuit comprising:

the micromachine switch according to claim 2; and the plurality of filters which are respectively connected to the plurality of second signal electrodes and which have frequency bands that are different from each other.

11. A duplexer circuit for switching between a plurality of duplexers, the plurality of duplexers having frequency bands that are different from each other, the duplexer circuit comprising:

the micromachine switch according to claim 2; and the plurality of duplexers which are respectively connected to the plurality of second signal electrodes and which have frequency bands that are different from each other.

12. A communication device for receiving and transmitting radio signals, the communication device comprising:

the duplexer circuit according to claim 11; and a plurality of antennas, respectively connected to the plurality of duplexers via the micromachine switch, for receiving and transmitting the radio signals.

* * * * *